(12) United States Patent
Chang

(10) Patent No.: US 11,916,037 B2
(45) Date of Patent: Feb. 27, 2024

(54) METHOD FOR BONDING SEMICONDUCTOR DEVICES, METHOD FOR FORMING SEMICONDUCTOR STRUCTURE AND SYSTEM FOR PERFORMING THE METHOD

(71) Applicant: TAIWAN SEMICONDUCTOR MANUFACTURING COMPANY LTD., Hsinchu (TW)

(72) Inventor: Jen-Yuan Chang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 88 days.

(21) Appl. No.: 17/586,723

(22) Filed: Jan. 27, 2022

(65) Prior Publication Data

US 2023/0238354 A1 Jul. 27, 2023

(51) Int. Cl.
*H01L 21/00* (2006.01)
*H01L 23/00* (2006.01)

(52) U.S. Cl.
CPC .... *H01L 24/80* (2013.01); *H01L 2224/80203* (2013.01); *H01L 2224/80211* (2013.01);
(Continued)

(58) Field of Classification Search
CPC .......... H01L 24/80; H01L 2224/80203; H01L 2224/80211; H01L 2224/80895; H01L 2224/80896; H01L 2224/32225; H01L 2924/0002; H01L 2924/01079; H01L 2924/00; H01L 2924/00014; H01L 24/83; H01L 2924/181; H01L 2924/01047; H01L 24/29; H01L 2224/16225; H01L 2224/48227; H01L 2924/01004; H01L 24/27; H01L 2924/09701; H01L 24/73; H01L 21/6836; H01L 25/0657; H01L 2924/15311; H01L 24/11; H01L 2224/32145; H01L 2924/01051; H01L 23/481; H01L 2224/32245; H01L 2924/3025; H01L 2924/01022; H01L 21/02164; H01L 2924/10329; H01L 2924/00013; H01L 2224/16; H01L 2924/0665; H01L 2924/01018; H01L 2924/01025; H01L 21/02274;
(Continued)

(56) References Cited

U.S. PATENT DOCUMENTS 4,818,323 A * 4/1989 d'Aragona ............. H01L 25/50
438/455
2012/0098140 A1 * 4/2012 Bartley .................. H01L 25/18
257/E23.174

FOREIGN PATENT DOCUMENTS

WO WO-2022158520 A1 * 7/2022

* cited by examiner

*Primary Examiner* — Niki H Nguyen
(74) *Attorney, Agent, or Firm* — WPAT LAW; Anthony King

(57) ABSTRACT

A method for bonding semiconductor devices is provided. The method may include several operations. A wafer and a chip are formed. The wafer and the chip are disposed in a low-pressure environment. A planar surface of the chip is moved toward a planar surface of the wafer. A void is formed between the planar surface of the chip and the planar surface of the wafer. The chip is bonded to the wafer. A bonded structure of the chip and the wafer is disposed under a standard atmosphere and a size of the void is reduced. A system for forming a semiconductor structure is also provided.

20 Claims, 33 Drawing Sheets

(52) U.S. Cl.
CPC ............... *H01L 2224/80895* (2013.01); *H01L 2224/80896* (2013.01)

(58) Field of Classification Search
CPC ....... H01L 21/6835; H01L 2224/05644; H01L 2224/0401; H01L 2924/04953; H01L 2225/06541; H01L 2924/19043; H01L 2924/30105; H01L 2224/13144; H01L 2924/3011; H01L 29/66545; H01L 2224/2919
See application file for complete search history.

METHOD FOR BONDING SEMICONDUCTOR DEVICES, METHOD FOR FORMING SEMICONDUCTOR STRUCTURE AND SYSTEM FOR PERFORMING THE METHOD

BACKGROUND

In the field of electronics, greater densities of device mounting are required. Therefore, a technique for bonding a semiconductor integrated circuit (chip) that has already been packaged onto a wafer (substrate) by a flip chip mounting technique has attracted attention. In chip-on-wafer bonding technology, by establishing electrical connection between the chip and the wafer through conductive components, the chip is bonded to the wafer. The chip should perfectly contact the wafer, and the electrical connections between the chip and the wafer should be ensured. However, it is observed that voids are sealed between the chip and the wafer, and the electrical connections may be disconnected by the voids.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, dimensions of the various features may be arbitrarily increased or reduced for clarity of discussion.

DETAILED DESCRIPTION

Figure 1:
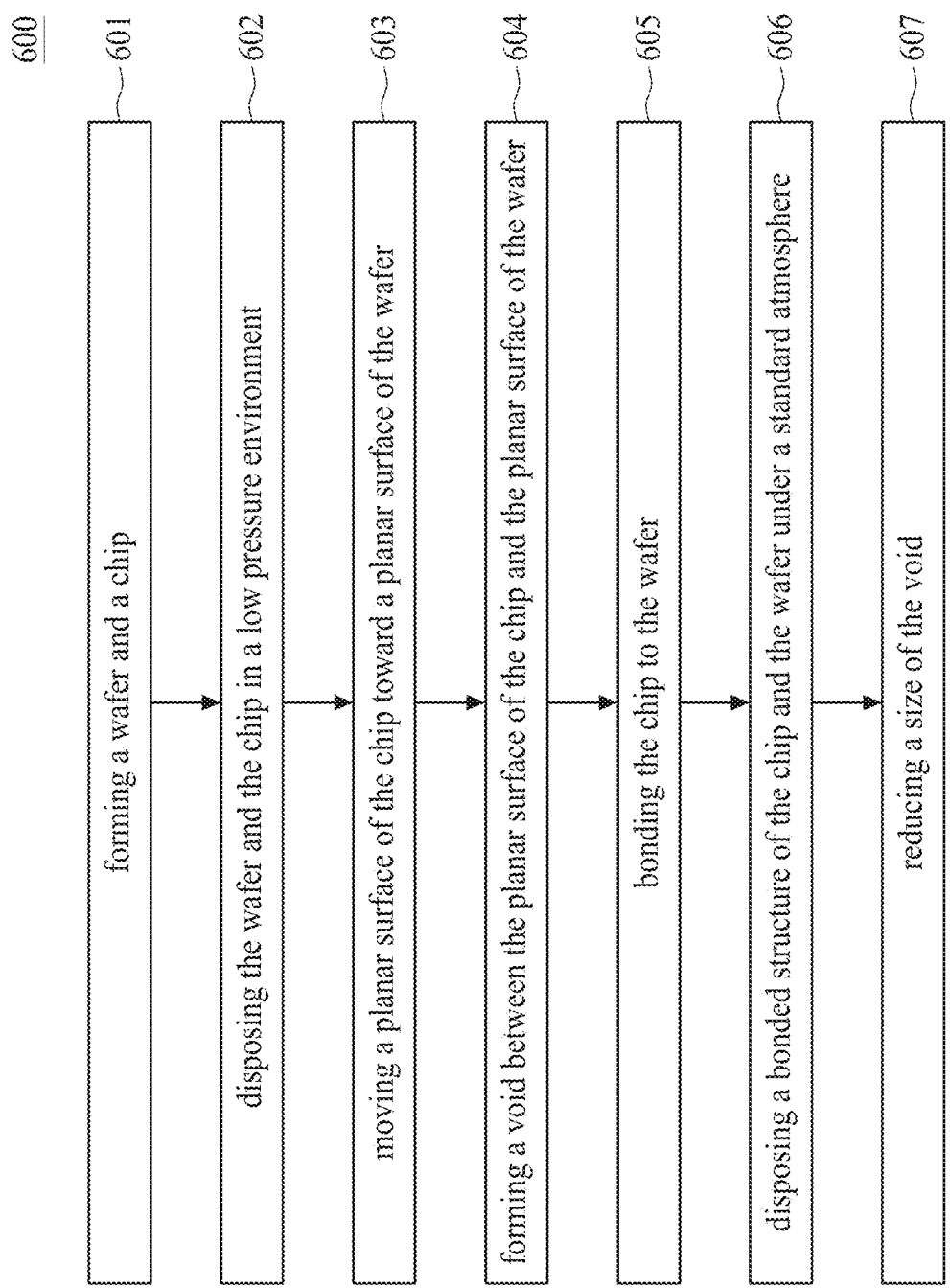
FIG. 1 is a flow diagram of a method for bonding semiconductor devices in accordance with some embodiments of the disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a flow diagram of a method 600 for bonding semiconductor devices in accordance with some embodiments of the present disclosure. In some embodiments, each of the semiconductor devices may include a die, a chip, or a wafer. For ease of illustration, a chip and a wafer are bonded for exemplary examples in illustration of the method 600. However, the invention is not limited thereto. The method 600 includes a number of operations (601, 602, 603, 604, 605, 606 and 607) and the description and illustration are not deemed as a limitation to the sequence of the operations. A wafer and a chip is formed or provided in the operation 601. The wafer and the chip are disposed in a low-pressure environment having an air pressure below a standard atmosphere in the operation 602. A planar surface of the wafer is moved toward a planar surface of the chip in the operation 603 for a bonding operation to be performed. A void can be formed between the planar surface of the chip and the planar surface of the wafer (i.e., at a bonding interface of the chip and the wafer) in the operation 604. A bonding operation is performed, and the chip is bonded to the wafer in the operation 605 thereby forming a bonded structure. The bonded structure including the chip and the wafer is disposed under a standard atmosphere, which has an air pressure greater than that of the low-pressure environment, in the operation 606. A size of the void is reduced in the operation 607 when the bonded structure is disposed under the standard atmosphere. The method 600 will be further described according to one or more embodiments. It should be noted that the operations of the method 600 may be rearranged or otherwise modified within the scope of the various aspects. It should be further noted that additional processes may be provided before, during, and after the method 600, and that some other processes may be only briefly described herein. Thus, other implementations are possible within the scope of the various aspects described herein.

Figure 2:
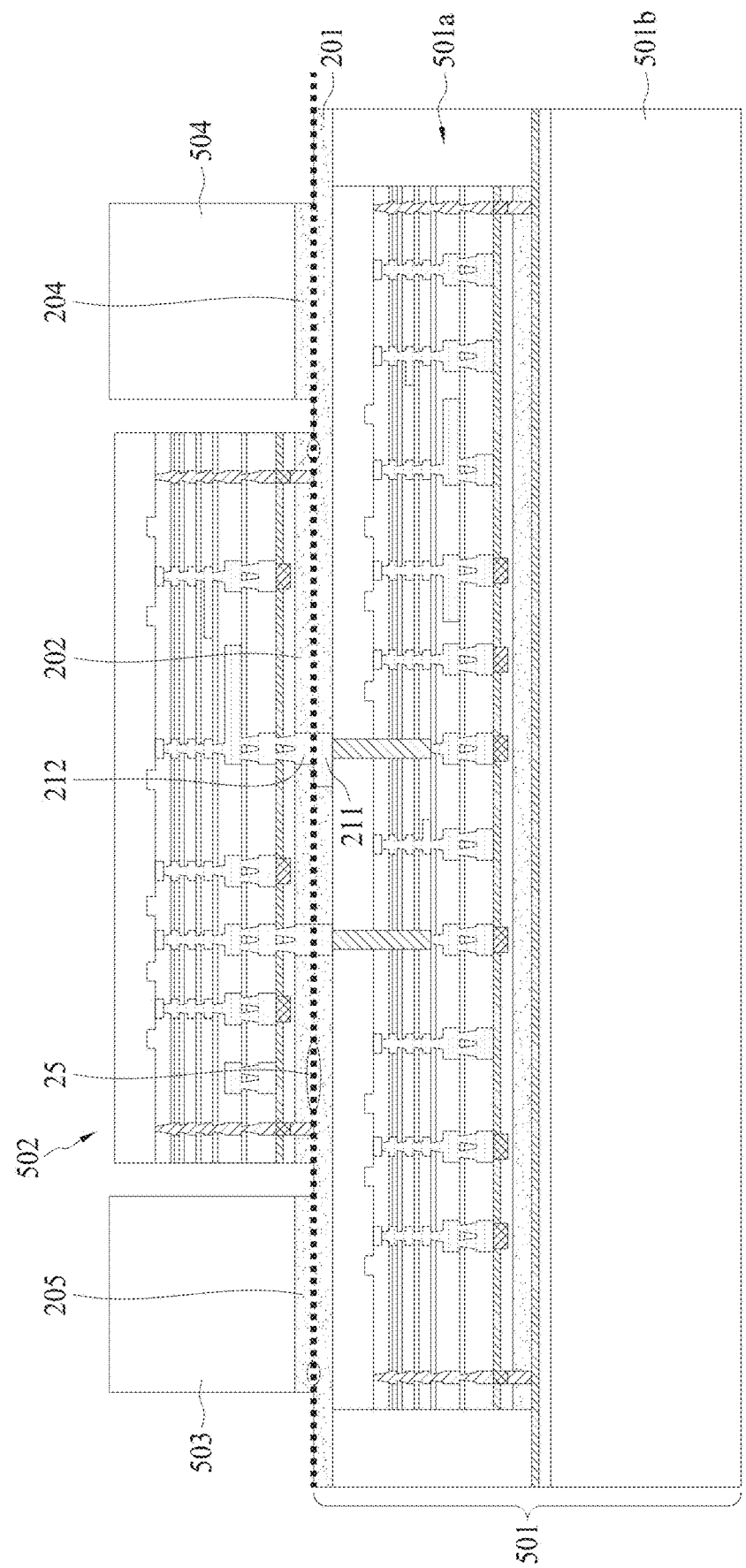
FIG. 2 is a schematic cross-sectional diagram of a semiconductor structure in accordance with some embodiments of the disclosure.

FIG. 2 shows a semiconductor structure 1 formed according to the method 600. In some embodiments, a plurality of chips (e.g., 502, 503 and 504) are bonded to a chip 501b of a device 501. In some embodiments, the chips 501b, 502, 503 and 504 can be referred to as dies 501b, 502, 503 and 504. In some embodiments, the device 501 includes a substrate 501a, and one or more chips are formed on the substrate 501a. In some embodiments, the chip 501b is one of the chips formed or bonded on the substrate 501a. In some embodiments, the substrate 501a is one of a silicon-on-insulator (SOI) substrate, a P-type substrate, an N-type substrate, and a sapphire substrate. The chips 501b, 502, 503 and 504 may be of different sizes as shown in FIG. 2, but are is not limited thereto. In some embodiments, the chips 501b, 502, 503 and 504 are manufactured by conventional semiconductor processes, and details of processes and structures are omitted herein. For ease of description, the following discussion focuses on the bonding between the chip 502 and the device 501, and conditions provided in following specification can be also applied to the bonding between the chip 503 and the device 501 and/or the bonding between the chip 504 and the device 501. It should be noted that in the disclosure, a wafer may refer to a semiconductive substrate, a processed silicon wafer (including electrical components or elements), a silicon-on-insulator (SOI) substrate, a P-type substrate, an N-type substrate, and a sapphire substrate; and a chip or a die is a semiconductor device formed after a dicing operation on a wafer and may have same or different dimensions. A device or a semiconductor device is a general term for a semiconductor structure prepared before a bonding operation. In some embodiments, a device or a semiconductor device includes one or more transistors, a circuit structure, an interconnect structure or a combination thereof.

In some embodiments, the device 501 includes a planar surface facing the chip 502. In some embodiments, the device 501 includes a dielectric material 201 and a conductive material 211 at the planar surface. In some embodiments, the chip 502 has a planar surface facing the device 501. In some embodiments, the chip 502 includes a dielectric material 202 and a conductive material 212 at the planar surface. One or more voids 25 may or may not be disposed between the chip 502 and the device 501. In some embodiments as shown in FIG. 2, the chip 504 is bonded to the device 501 and there is no void between the chip 504 and the device 501. In some embodiments, one or more of the voids 25 are disposed between the chip 502 and the device 501. In some embodiments, the one or more voids 25 are defined by the dielectric material 201 and the dielectric material 202. In some embodiments, the one or more voids 25 are sealed by the dielectric material 201 and the dielectric material 202. In some embodiments, the one or more voids 25 are not disposed between the conductive material 211 and the conductive material 212.

In order to further illustrate details of the method 600 and the concept of the present disclosure, schematic diagrams as shown in FIGS. 3 to 13 are provided in accordance with some embodiments of the present disclosure. FIGS. 3 to 13 show schematic diagrams at different stages of the method 600 for forming a semiconductor structure 2 similar to the semiconductor structure 1 of FIG. 2. Each of the chip 502 and the deice 501 may include a plurality of electrical connections to define multiple electrical paths extending through the chip 502 and the chip 501a of the deice 501. In some embodiments, the chip 502 and the device 501 individually include circuit structures and active components. For ease of illustration and simplicity of the diagrams, detailed structures of the device 501 and the chip 502 are omitted from the diagrams.

Figure 3:
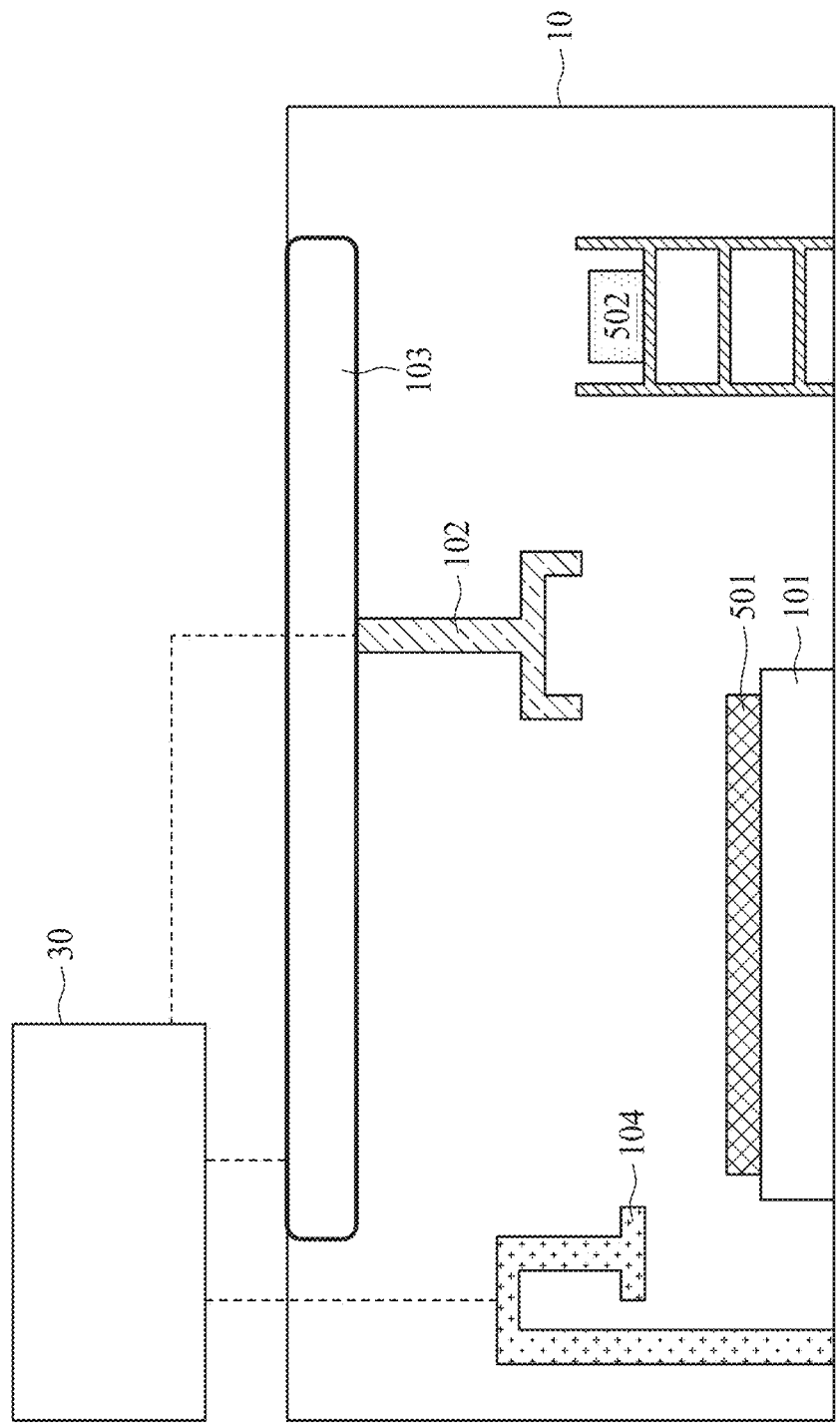
FIGS. 3 to 10 are schematic diagrams at different stages of a method for bonding semiconductor devices in accordance with different embodiments of the disclosure.

Please refer to FIG. 3, which is a schematic diagram in accordance with the operations 601 to 602 of the method 600 according to some embodiments of the present disclosure, a device 501 and a chip 502 are formed and disposed in a low-pressure environment. In some embodiments, the device 501 is a wafer 501. In some embodiments, the low-pressure environment has an air pressure less than a standard atmosphere. In some embodiments, the air pressure of the low-pressure environment is substantially equal to or less than $1\times10^3$ Pascal (Pa). In some embodiments, the air pressure of the low-pressure environment is substantially equal to or less than $1\times10^{-1}$ Pa. In some embodiments, the low-pressure environment is defined by a chamber 10. In some embodiments, a stage 101, a machine arm 102, a transmission agency 103, and a bonding apparatus 104 are disposed in the chamber 10. In some embodiments, the wafer 501 is disposed on the stage 101 in the chamber 10. In some embodiments, the chip 502 is on a load-lock type holder disposed in the chamber 10. In some embodiments, the machine arm 102 is connected to the transmission agency 103. In some embodiments, the transmission agency 103 supports the machine arm 102 and facilitates movements of the machine arm 102. In some embodiments, the transmission agency 103 includes tracks and motors, and the machine arm 102 moves along the tracks through the motors. In some embodiments, the bonding apparatus 104 is configured to move toward the chip 502 and provide a downward force on the chip 502 during a bonding operation. In some embodiments, the machine arm 102, the transmission agency 103, and the bonding apparatus 104 individually have electrical or signal connections with a controller 30 directly or indirectly. The machine arm 102 may connect to the controller 30 through the transmission agency 103. In some embodiments, the machine arm 102 is a grabbing-type machine arm. In some embodiments, the machine arm 102 is a sucking-type machine arm.

Figure 4:
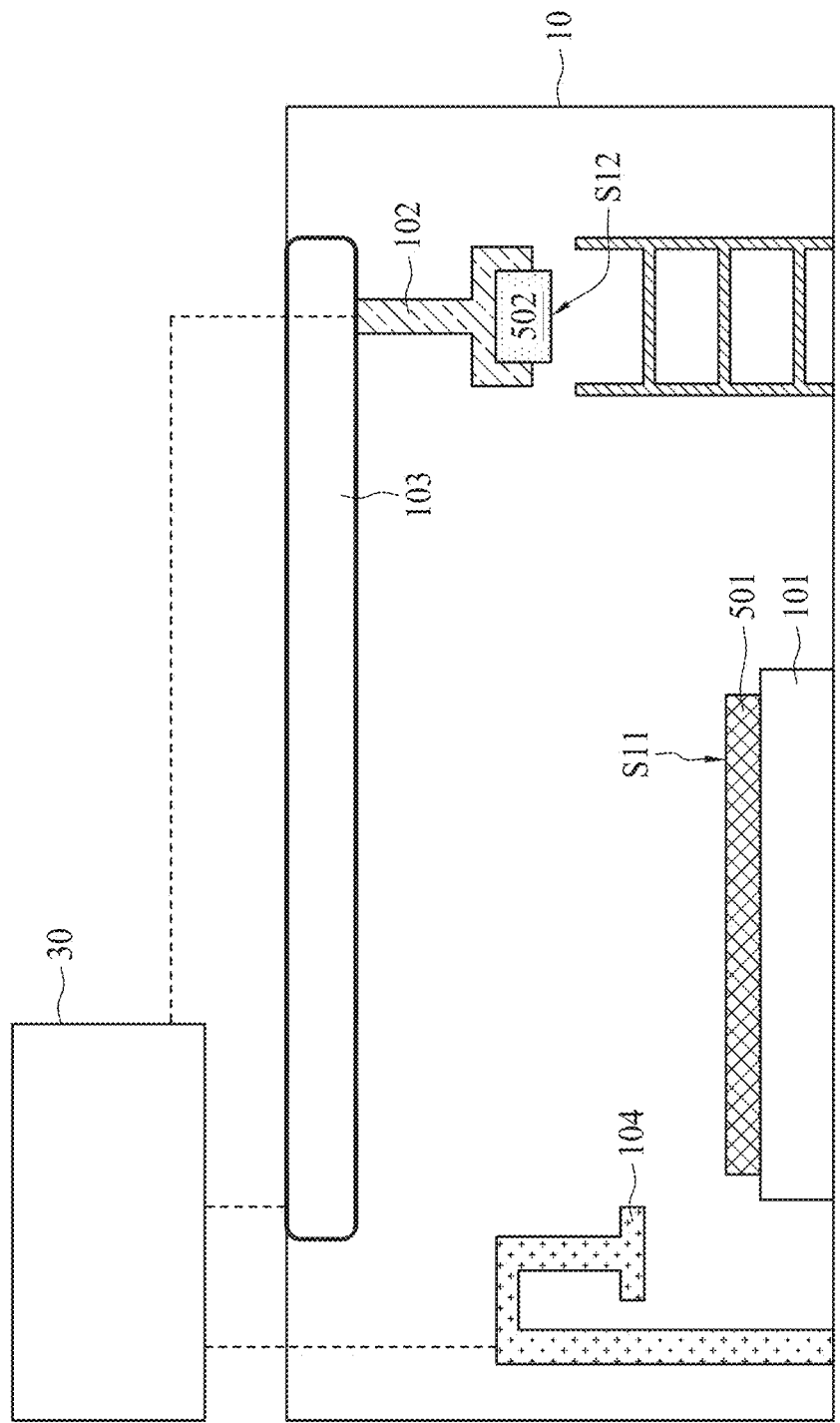
Figure 5:
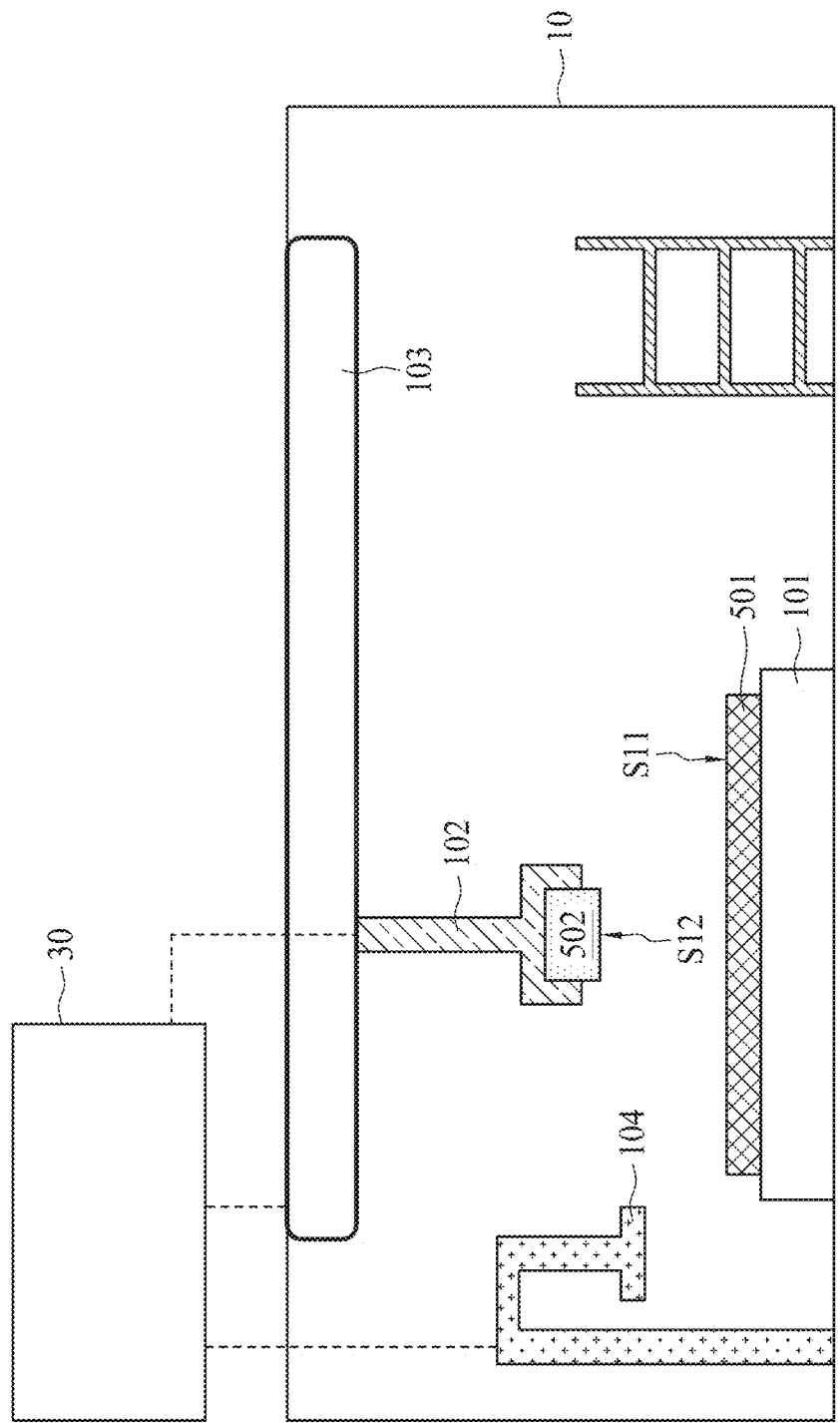
Figure 6:
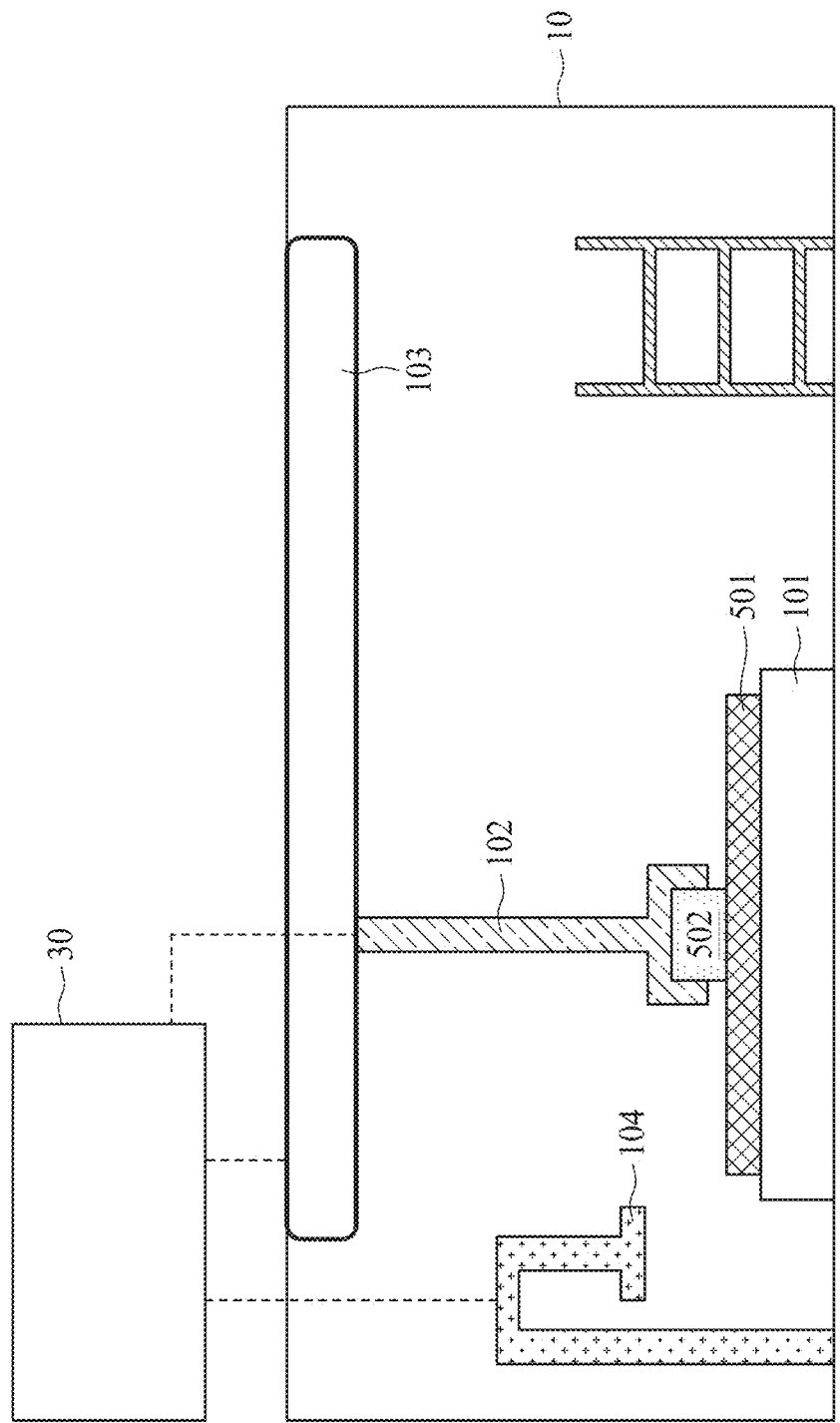
Figure 7:
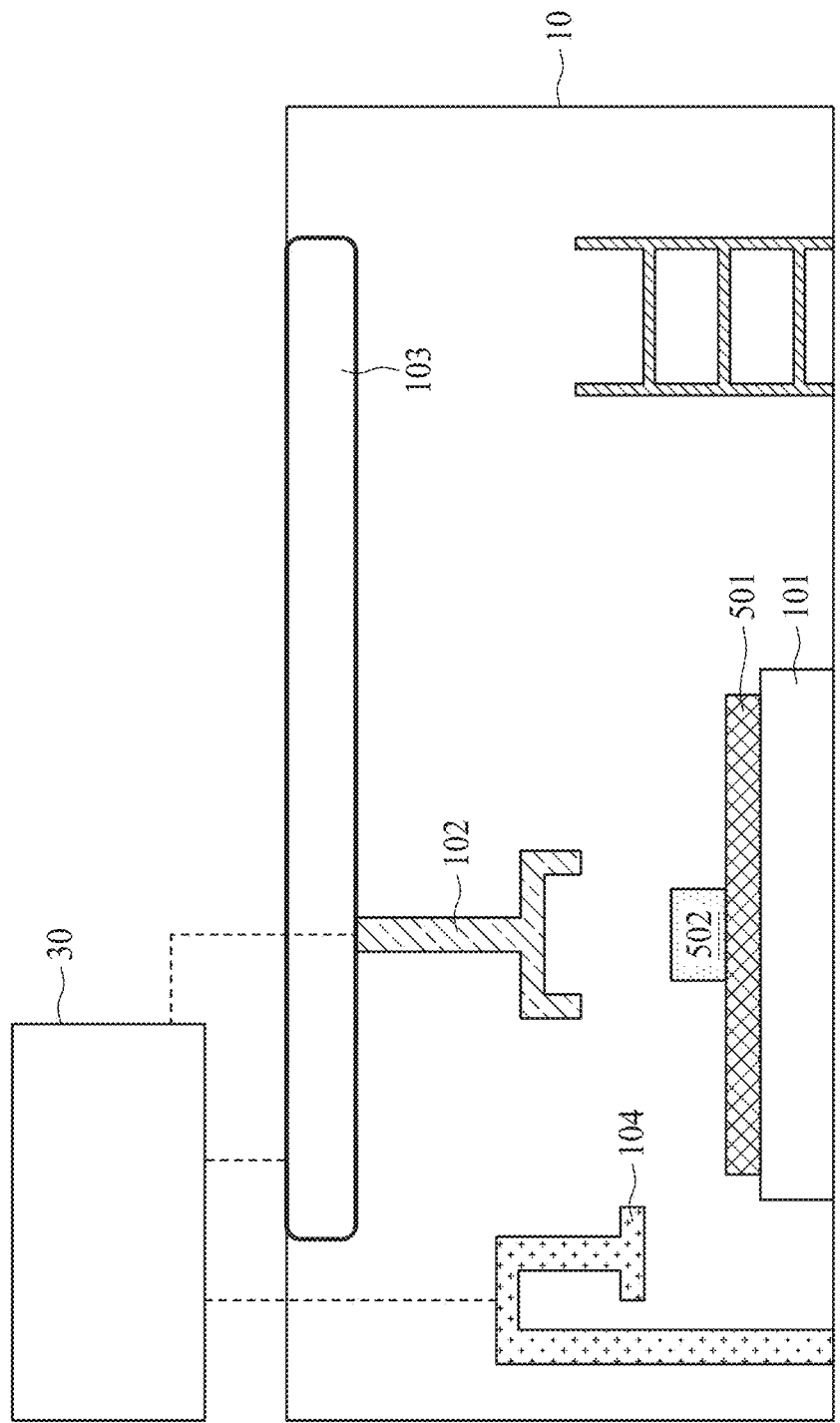

Please refer to FIGS. 4 to 7, which are schematic diagrams in accordance with the operation 603 of the method 600 according to some embodiments of the present disclosure. In some embodiments, the chip 502 is moved toward the wafer 501 and the chip 502 is picked up by the machine arm 102 as shown in FIG. 4. The wafer 501 may include a planar surface S11, and the chip 502 may include a planar surface S12. In some embodiments, each of the planar surface S11 and the planar surface S12 includes multiple materials. In some embodiments, the planar surface S11 of the wafer 501 includes at least a dielectric material (e.g., 201 of FIG. 2) and a conductive material (e.g., 211 of FIG. 2). In some embodiments, the planar surface S12 of the chip 502 includes at least a dielectric material (e.g., 202 of FIG. 2) and a conductive material (e.g., 212 of FIG. 2). The planar surface S12 of the chip 502 is to be bonded to the planar surface S11 of the wafer 501. In some embodiments, the chip 502 is held and then moved above the wafer 501 by the machine arm 102 as shown in FIG. 5. In some embodiments, the chip 502 is disposed over and then moved toward the wafer 501. In some embodiments, the planar surface S12 of the chip 502 faces the planar surface S11 of the wafer 501. In some embodiments, the planar surface S12 of the chip 502 is moved toward the planar surface S11 of the wafer 501 by the machine arm 102 as shown in FIG. 6. In some embodiments, the chip 502 is released by the machine arm 103 and disposed on the planar surface S11 of the wafer 501 as shown in FIG. 7. The chip 502 is disposed on the wafer 501, and a gap between the chip 502 and the wafer 501 may be present.

Figure 8:
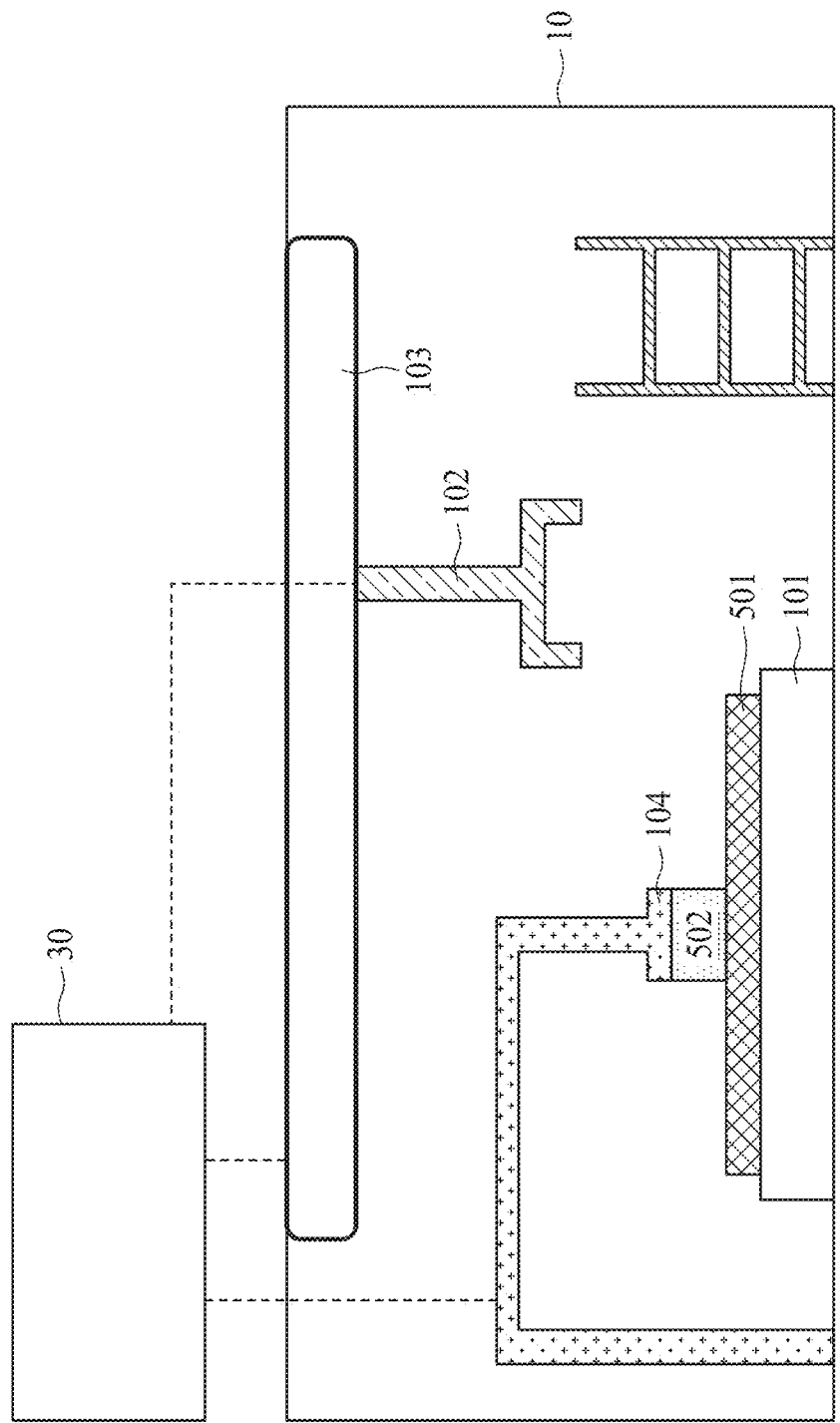
Figure 9:
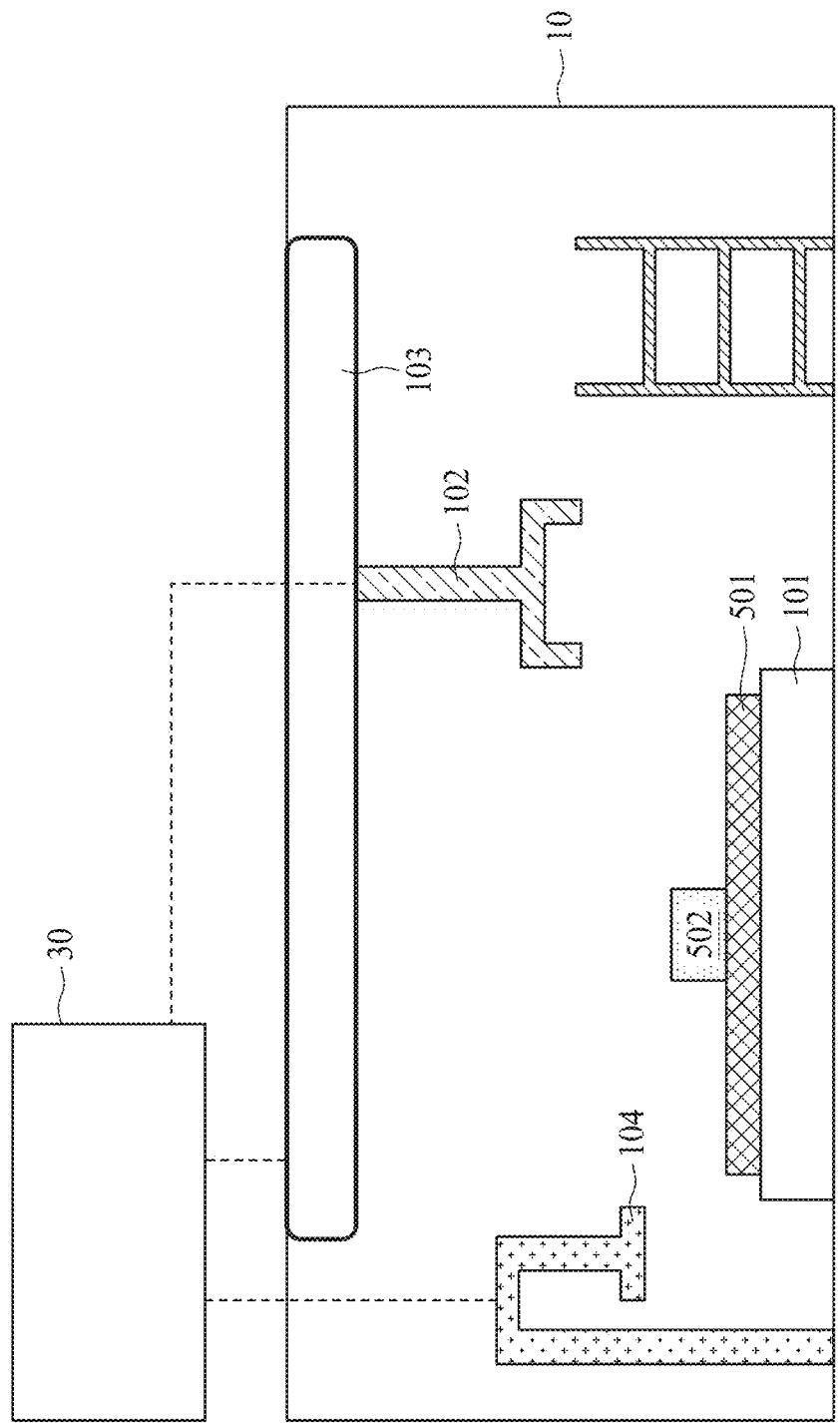

Please refer to FIGS. 8 to 9, which are schematic diagrams in accordance with the operations 604 to 605 of the method 600 according to some embodiments of the present disclosure. In some embodiments, a bonding operation is performed to bond the chip 502 to the wafer 501, and one or more voids are formed between the chip 502 and the wafer 501. In some embodiments, the bonding operation includes one or more of a fusion bonding operation, a hybrid bonding operation, an eutectic bonding operation and a direct bonding operation. In some embodiments, a temperature of the low-pressure environment is increased prior to or during the bonding operation. A head of the bonding apparatus 104 may be moved onto the chip 502 for the bonding operation as shown in FIG. 8. In some embodiments, the bonding apparatus 104 provides a force on the chip 502 to facilitate bonding of the chip 502 to the wafer 501. In some embodiments, the force from the bonding apparatus 104 firstly provides pressure on a central region of the chip 502 and gradually outward toward a peripheral region of the chip 502 for a purpose of squeezing out possible air gases between the chip 502 and the wafer 501. However, it is observed that some of the air gases may stay between the chip 502 and the wafer 501 to form one or more voids at a bonding interface of the chip 502 and the wafer 501. After the bonding operation, the head of the bonding apparatus 104 is moved away from the chip 502 as shown in FIG. 9, and a bonded structure 2 is formed.

Figure 10:
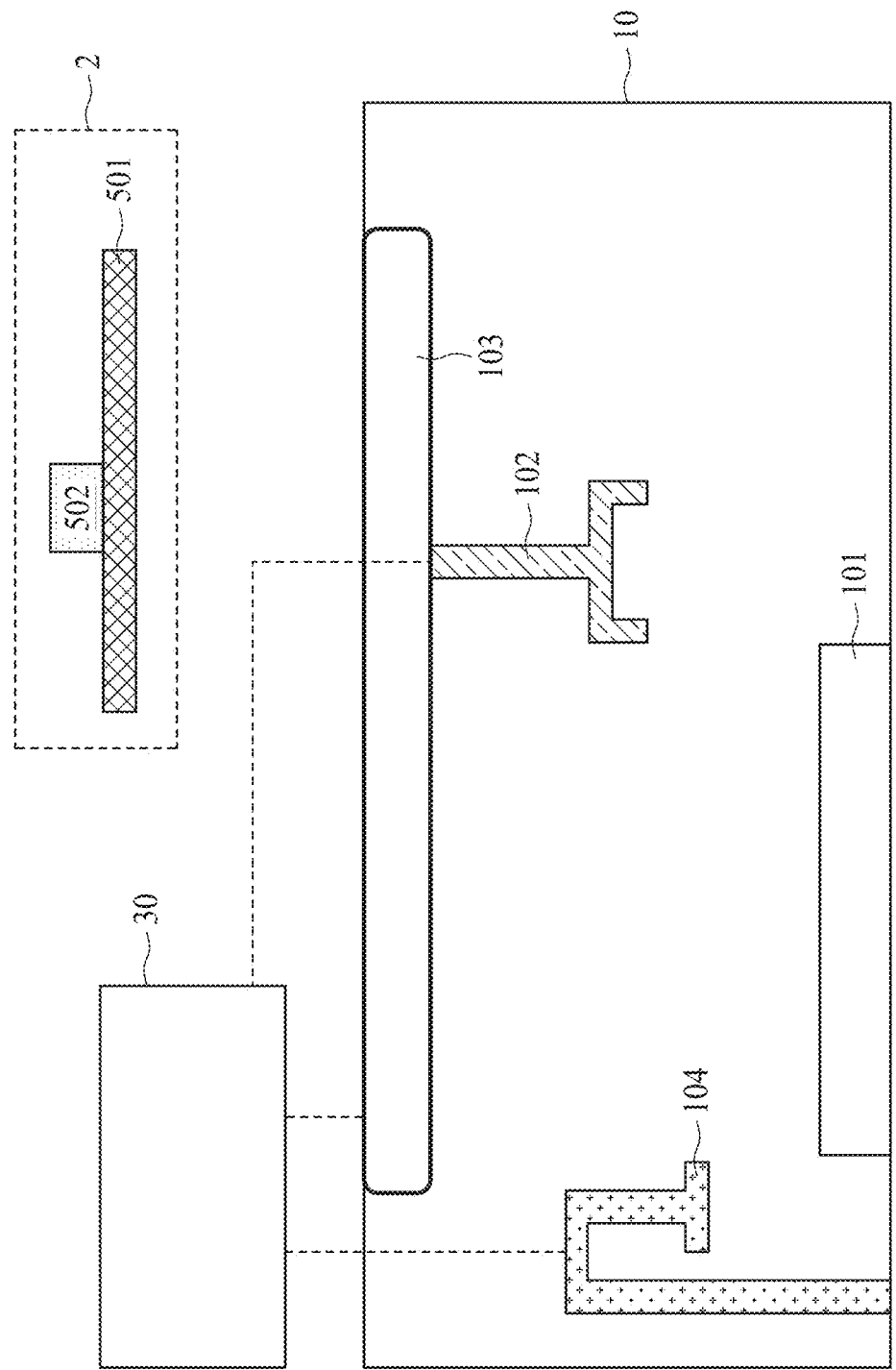

Please refer to FIG. 10, which is a schematic diagram in accordance with the operations 606 to 607 of the method 600 according to some embodiments of the present disclosure, a semiconductor structure 2 is disposed under a standard atmosphere and a size of the void is reduced. In some embodiments, the semiconductor structure 2 is a bonded structure of the wafer 501 and the chip 502 after the bonding operation. In some embodiments, an air pressure inside the chamber 10 is increased to a standard atmosphere. In some embodiments, the semiconductor structure 2 is moved out of the chamber 10 and disposed under the standard atmosphere. The standard atmosphere may be represented as 1 atm, 101.325 kPa, or 760 Torr. In some embodiments, the semiconductor structure 2 is transported out of the chamber 10 by another machine arm or a transportation apparatus.

Figure 11:
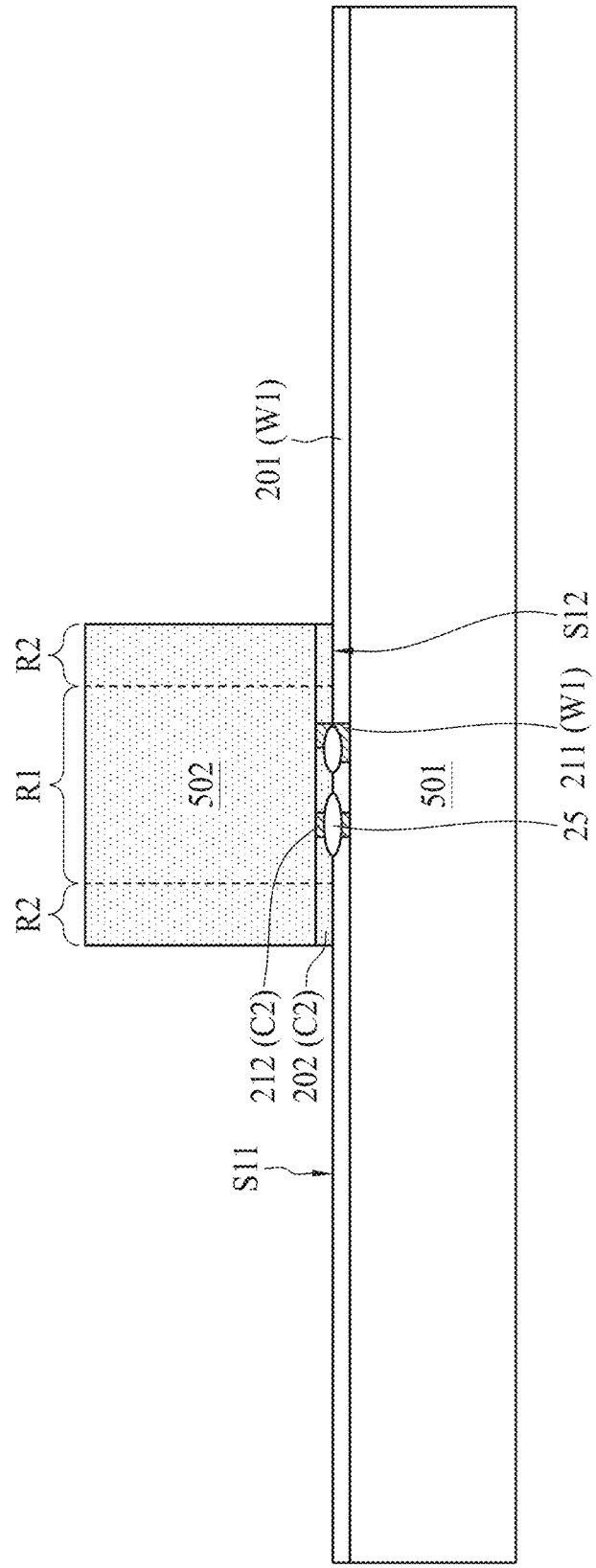
FIGS. 11 to 13 are schematic cross-sectional diagrams of semiconductor devices at different stages of a method for forming a semiconductor structure in accordance with different embodiments of the disclosure.
Figure 12:
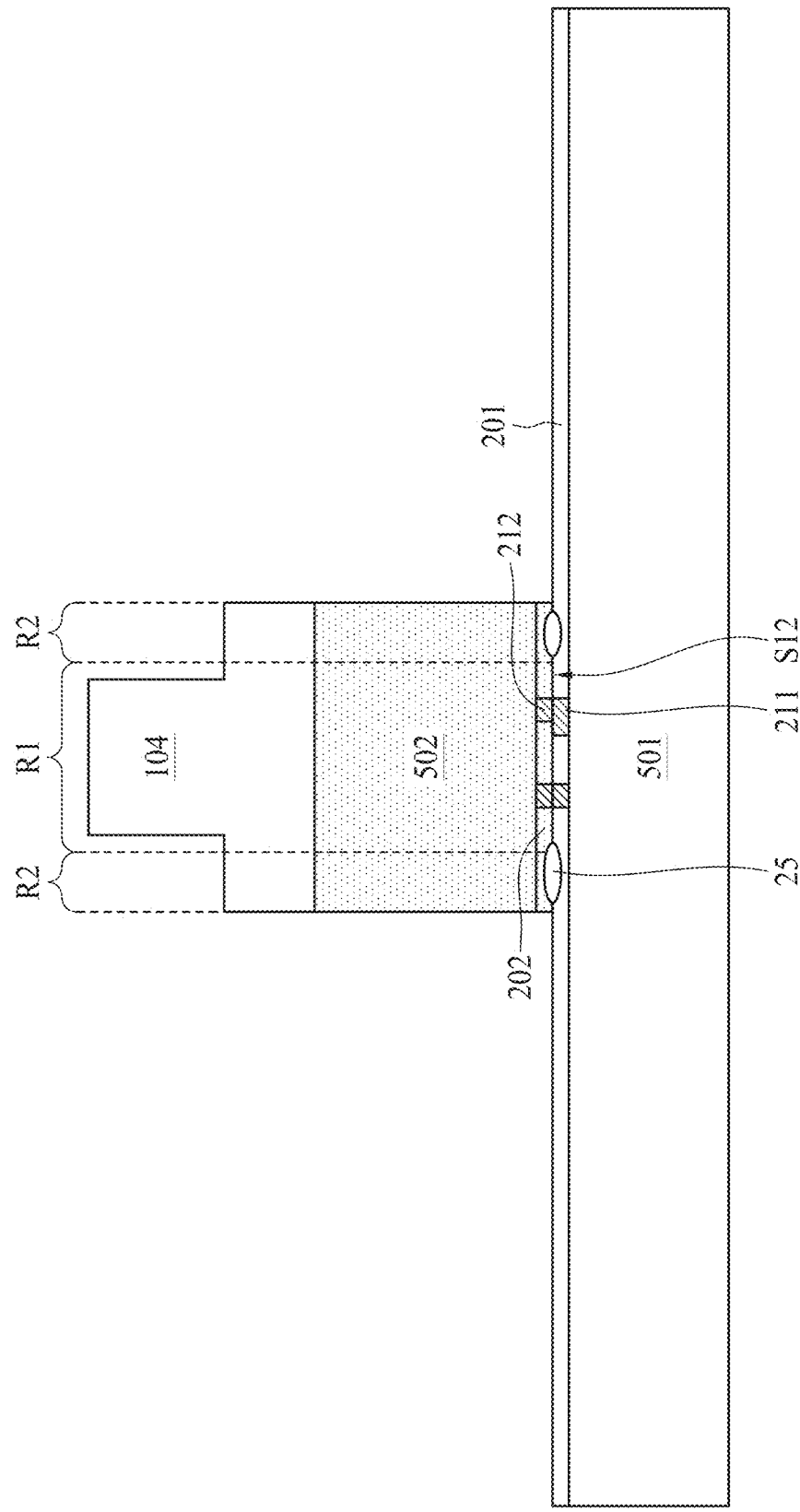

Please refer to FIGS. 11 to 12, which are enlarged schematic diagrams of the chip 502 and the wafer 501 at different stages during the bonding operation in accordance with FIGS. 8 to 9 according to some embodiments of the present disclosure. In some embodiments, one or more voids 25 are formed at a bonding interface or between the planar surface S12 of the chip 502 and the planar surface S11 of the wafer 501. In some embodiments, when the chip 502 is disposed on the wafer 501, the dielectric material 202 at a peripheral region R2 of the chip 502 contacts the dielectric material 201 of the wafer 501 while the dielectric material 202 at a central region R1 of the chip 502 is at least partially separated from the dielectric material 201 by air gases. In some embodiments, as the temperature increases, the dielectric material 202 at the peripheral region R2 of the chip 502 may fuse with the dielectric material 201 of the wafer 501. In some embodiments, the voids 25 are formed at the central region R1 of the chip 502 as shown in FIG. 11. The bonding apparatus 104 may provide a force on the chip 502 from the central region R1 toward the peripheral region R2, in which this operation intends to bond the chip 502 to the wafer 501 from the central region R1 toward the peripheral region R2 and also to squeeze out possible air gases as descripted above. The dielectric material 202 at the central region R1 of the chip 502 contacts and fuses with the dielectric material 201, and the voids 25 are moved from the central region R1 toward the peripheral region R2 of the chip 502. However, the dielectric material 202 at the peripheral region R2 of the chip 502 may fuse with the dielectric material 201 prior to fusion of the dielectric material 202 at the central region of the chip 502 with the dielectric material 202. In some embodiments, the moved voids 25 stop at the peripheral region R2 of the chip 502. It should be noted that different chips may have different dimensions of a central region and a peripheral region. The central region R2 may refer to a region of most or all electrical connections of the chip 502 to be connected to the wafer 501. In some embodiments, a majority or an entirety of the conductive material 212 at the planar surface S12 is disposed in the central region R1. In some embodiments, very little or none of the conductive material 212 at the planar surface S12 is disposed in the peripheral region R2. In some embodiments, the peripheral region R2 surrounds the central region R1. In some embodiments, the peripheral region R2 encircles the central region R1.

Figure 13:
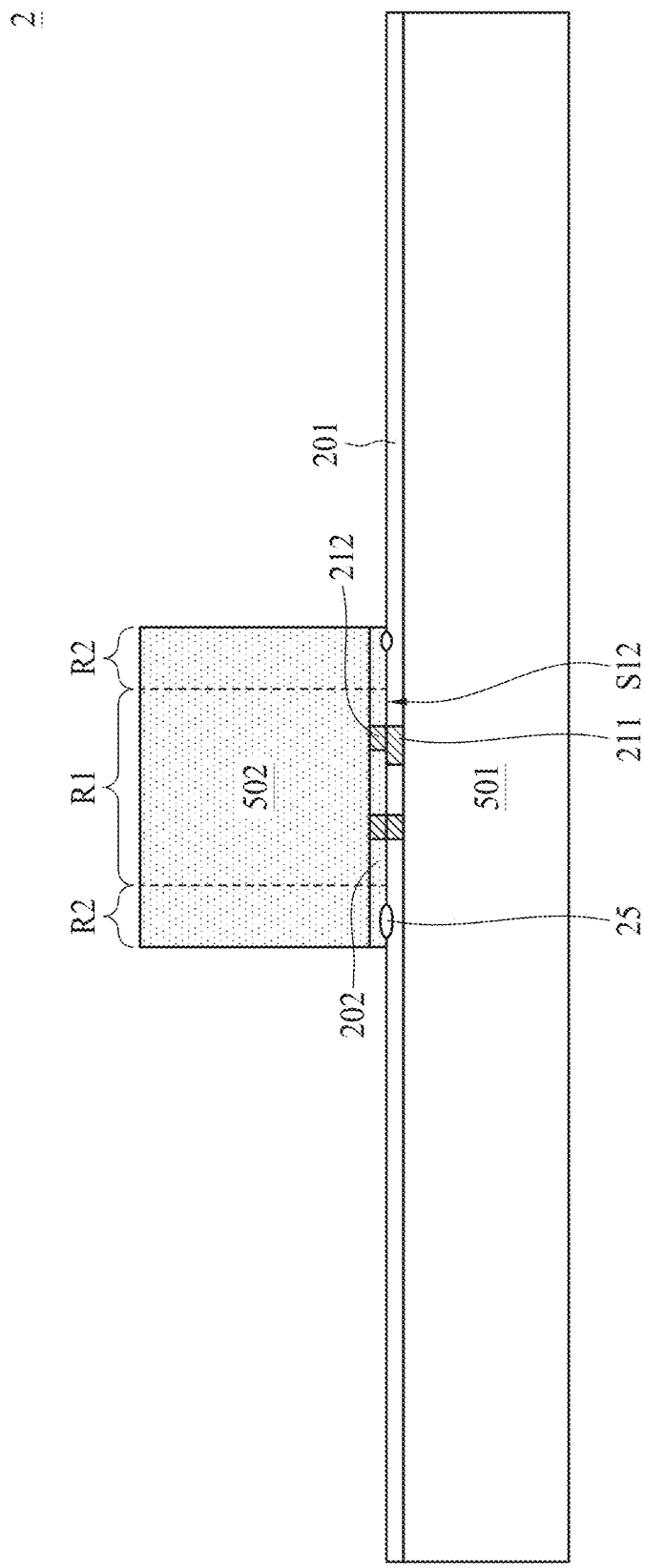

Please refer to FIG. 13, which is an enlarged schematic diagram of the semiconductor structure 2 disposed under the standard atmosphere after the bonding operation in accordance with FIG. 10 according to some embodiments of the present disclosure. In some embodiments, the sizes of the voids 25 are gradually decreased with an air pressure of the chamber 10 gradually increased to the standard atmosphere. In some embodiments, the sizes of the voids 25 are reduced during or after movement of the semiconductor structure 2 outside the chamber 10. In some embodiments, a volume of each of the voids 25 is reduced to ½ or less of the original volume, and that is, a volume of a void 25 shown in FIG. 13 is ½ or less of a volume of a corresponding void 25 shown in FIG. 12. In some embodiments, the volume of the void 25 shown in FIG. 13 is ¹⁄₁₀ of the volume of the corresponding void 25 shown in FIG. 12. As described above, air gases may be disposed between the chip 502 and the wafer 501 to from the voids 25. However, in the low-pressure environment, gas molecules in the voids 25 are very few, and thus sizes of the voids 25 are reduced when the voids 25 are disposed under the standard atmosphere. A change of air pressure from the low-pressure environment inside the chamber 10 to the standard atmosphere (1 atm, 101.325 kPa, or 760 Torr) of an environment outside the chamber 10 results in a size reduction of the voids 25. In some embodiments, the air pressure outside the chamber 10 is greater than the air pressure inside the chamber 10, which is equivalent to providing forces on the voids 25 and thereby reducing the sizes of the voids 25. In some embodiments, an entirety of the voids 25 is moved to the peripheral region R2 of the chip 502. In some embodiments as shown in FIGS. 12 to 13, at least one of the voids 25 is not entirely in the peripheral region R2 of the chip 502 after the bonding operation in the chamber 10, but due to the size reduction of the voids 25, the voids 25 are moved to the peripheral region R2 when the semiconductor structure 2 is disposed under the standard atmosphere.

As described above, in some embodiments, electrical connections between the wafer 501 and the chip 502 are mostly or all disposed in the central region R1 of the chip 502. In some embodiments, the voids 25 are moved to the peripheral region R2 by the force from the head of the bonding apparatus 104 to avoid disconnections of electrical connections in the central region R1 by the voids 25. In some embodiments, the sizes of the voids 25 are reduced and thus the voids 25 can be kept entirely in the peripheral region R2 after the operation 607 as shown in FIG. 13. In some embodiments, the sizes of the voids 25 are reduced and a possibility of electrical disconnections resulted by the presence of the voids between the wafer 501 and the chip 502 can therefore be minimized. It should be noted that the voids 25 may or may not be present between at the bonding interface of the chip 502 and the wafer 501. In some embodiments as shown in FIG. 2, the semiconductor structure 1 includes the chip 504 on the chip 501b without a void 25 formed therebetween, and also includes the chip 502 on the chip 501b with more than one voids 25 formed therebetween. Therefore, if even at least one void is present between two bonded devices, it can be moved to a peripheral region of a top chip or a top die, and disconnection of the electrical connections between the two bonded devices can be minimized or prevented.

Figure 14:
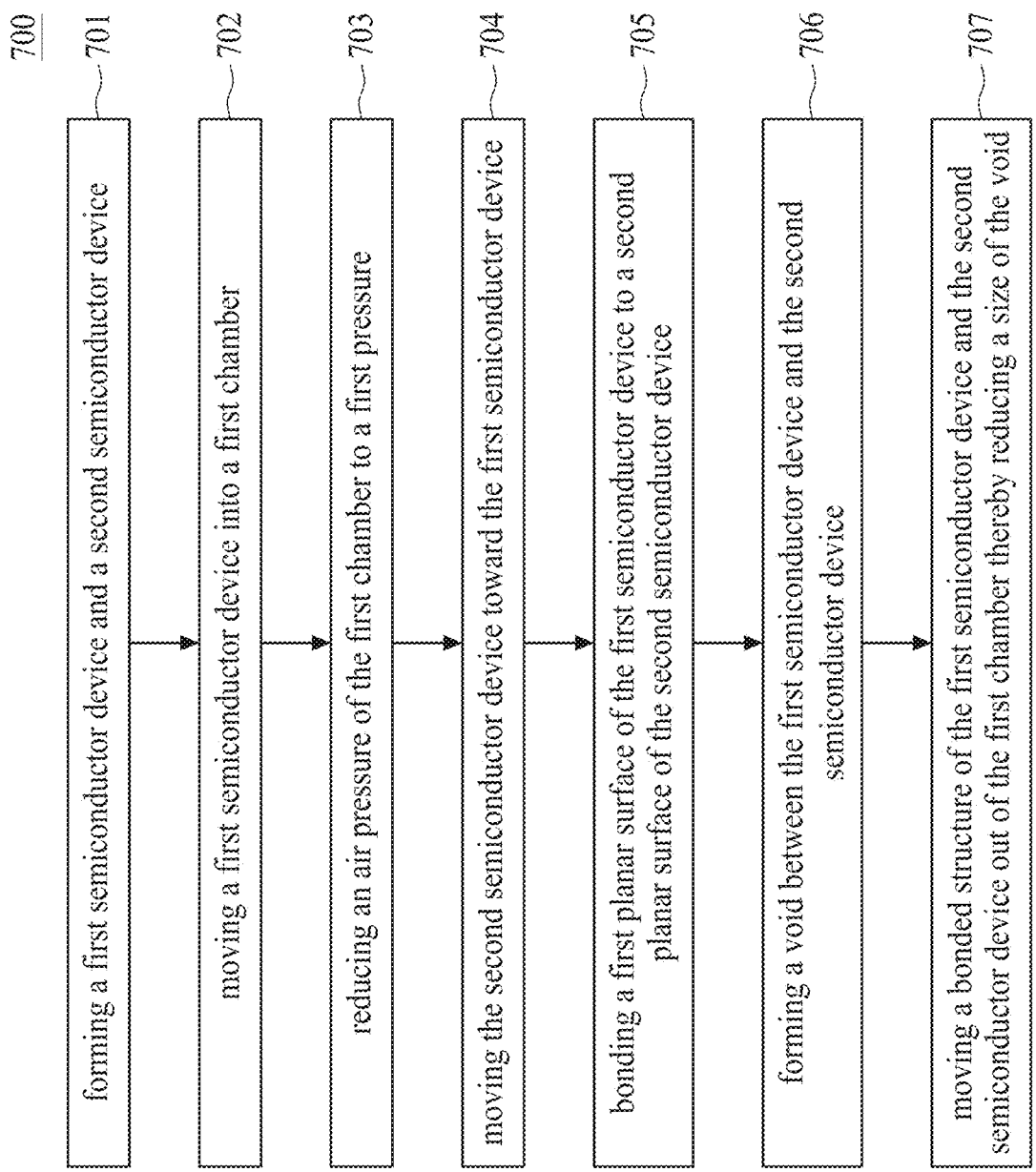
FIG. 14 is a flow diagram of a method for manufacturing a semiconductor structure in accordance with some embodiments of the disclosure.

FIG. 14 is a flow diagram of a method 700 for forming a semiconductor structure in accordance with some embodiments of the present disclosure. According to the method 600 and the embodiments as described above, the disclosure further provides the method 700 for forming a semiconductor structure. The method 700 includes a number of operations (701, 702, 703, 704, 705, 706 and 707) and the description and illustration are not deemed as a limitation to the sequence of the operations. A first semiconductor device and a second semiconductor device are formed or provided in the operation 701. The first semiconductor device is moved or transported into a first chamber in the operation 702. An air pressure of the first chamber is reduced to a first pressure lower than a standard atmosphere in the operation 703 before, after or during the operation 702. The second semiconductor device is moved toward the first semiconductor device after the operation 702, and before, after of during the operation 703. A first planar surface of the first semiconductor device is bonded to a second planar surface of the second semiconductor device in the operation 705 under the first pressure in the first chamber thereby forming a bonded structure. A void is formed between the first semiconductor device and the second semiconductor device in the operation 706, before or during the operation 705. The bonded structure is moved out of the first chamber thereby reducing a size of the void in the operation 707. The method 700 will be further described according to one or more embodiments. It should be noted that the operations of the method 700 may be rearranged or otherwise modified within the scope of the various aspects. It should be further noted that additional processes may be provided before, during, and after the method 700, and that some other processes may be only briefly described herein. Thus, other implementations are possible within the scope of the various aspects described herein. A system for performing the method 700 is also provided.

FIGS. 15 to 19 are schematic diagrams at different stages of the method 700 applied to the system 801 for forming a semiconductor structure 3 similar to the semiconductor structure 2 of FIG. 13. In order to further illustrate details of the method 700 and the concept of the present disclosure, schematic diagrams as shown in FIGS. 15 to 19 are provided in accordance with some embodiments of the present disclosure.

Figure 15:
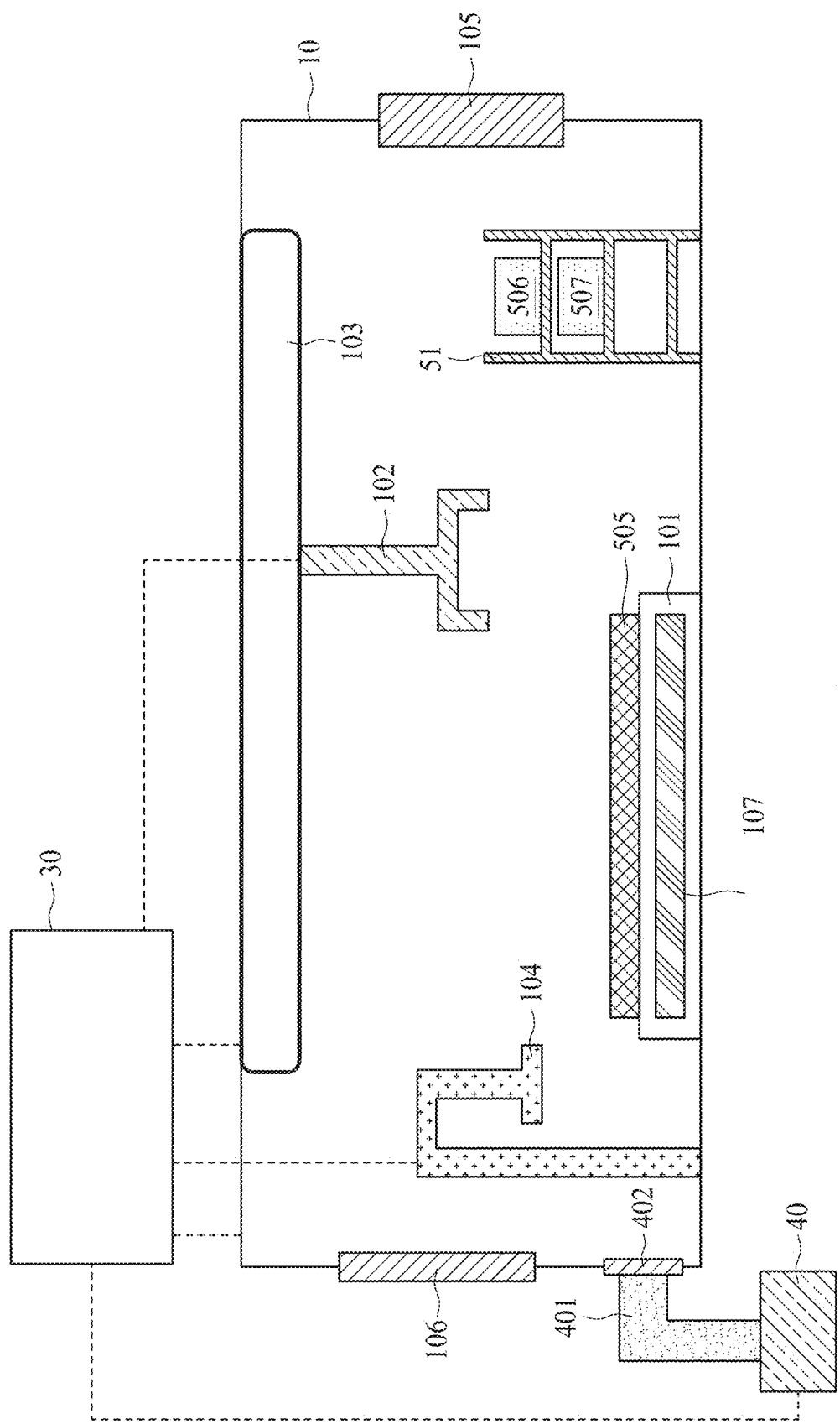
FIGS. 15 to 19 are schematic diagrams at different stages of a method for manufacturing a semiconductor structure in accordance with different embodiments of the disclosure.

Please refer to FIG. 15, which is a schematic diagram in accordance with the operations 701 to 703 of the method 700 according to some embodiments of the present disclosure. The first semiconductor device 505, the second semiconductor device 506 and a third semiconductor device 507 may be formed, received or provided separately, concurrently or sequentially before a bonding operation. In some embodiments, the first semiconductor device 505, the second semiconductor device 506 and a third semiconductor device 507 are transported into and disposed in the chamber 10 of the system 801 for the bonding operation. The first semiconductor device 505, the second semiconductor device 506, and the third semiconductor device 507 individually can be a wafer, a chip or a die. In some embodiments, the first semiconductor device 505 is transported into the chamber 10 through a valve 106 on a sidewall of the chamber 10. In some embodiments, the first semiconductor device 505 is transported by a machine arm outside the chamber 10. In some embodiments, the second semiconductor device 506 and the third semiconductor device 507 are transported into the chamber 10 through a valve 105 on a sidewall of the chamber 10. In some embodiments, the second semiconductor device 506 and the third semiconductor device 507 are transported by a machine arm outside the chamber 10. In some embodiments, the second semiconductor device 506 and the third semiconductor device 507 are disposed on a load-lock type holder 51 in the chamber 10. The load-lock type holder 51 can be transported into the chamber 10 through the valve 105 together with the second semiconductor device 506 and the third semiconductor device 507 or individually prior to the transportation of the second semiconductor device 506 and the third semiconductor device 507. It should be noted that the figures are just for a purpose of illustration, and relative sizes of the chambers and valves may vary from those depicted in the figures.

In some embodiments, the chamber 10 is configured to provide a low-pressure environment for a bonding operation. In some embodiments, the bonding operation includes one or more of a fusion bonding operation, a hybrid bonding operation, an eutectic bonding operation and a direct bonding operation. In some embodiments, the air pressure is reduced by evacuation of gas molecules from the chamber 10. In some embodiments, the gas molecules in the chamber 10 are evacuated by a motor unit 40. In some embodiments, the motor unit 40 is connected to a valve 402 disposed on an inner sidewall of the chamber 10 through a conduit 401. In some embodiments, the valve 402 is electrically or signally connected to a controller 30, and a state (e.g., open or closed) of the valve 402 can be controlled by the controller 30. In some embodiments, the motor unit 40 includes a turbo pump, an ion pump, a cryo pump or a combination thereof. In some embodiments, the operation 703 can be performed prior to, after, or during the operation 702. In some embodiments, the operation 703 stops when the air pressure inside the chamber 10 is substantially equal to or less than $1 \times 10^3$ Pa. In some embodiments, the operation 703 stops when the air pressure inside the chamber 10 is substantially equal to or less than $1 \times 10^{-1}$ Pa.

Figure 16:
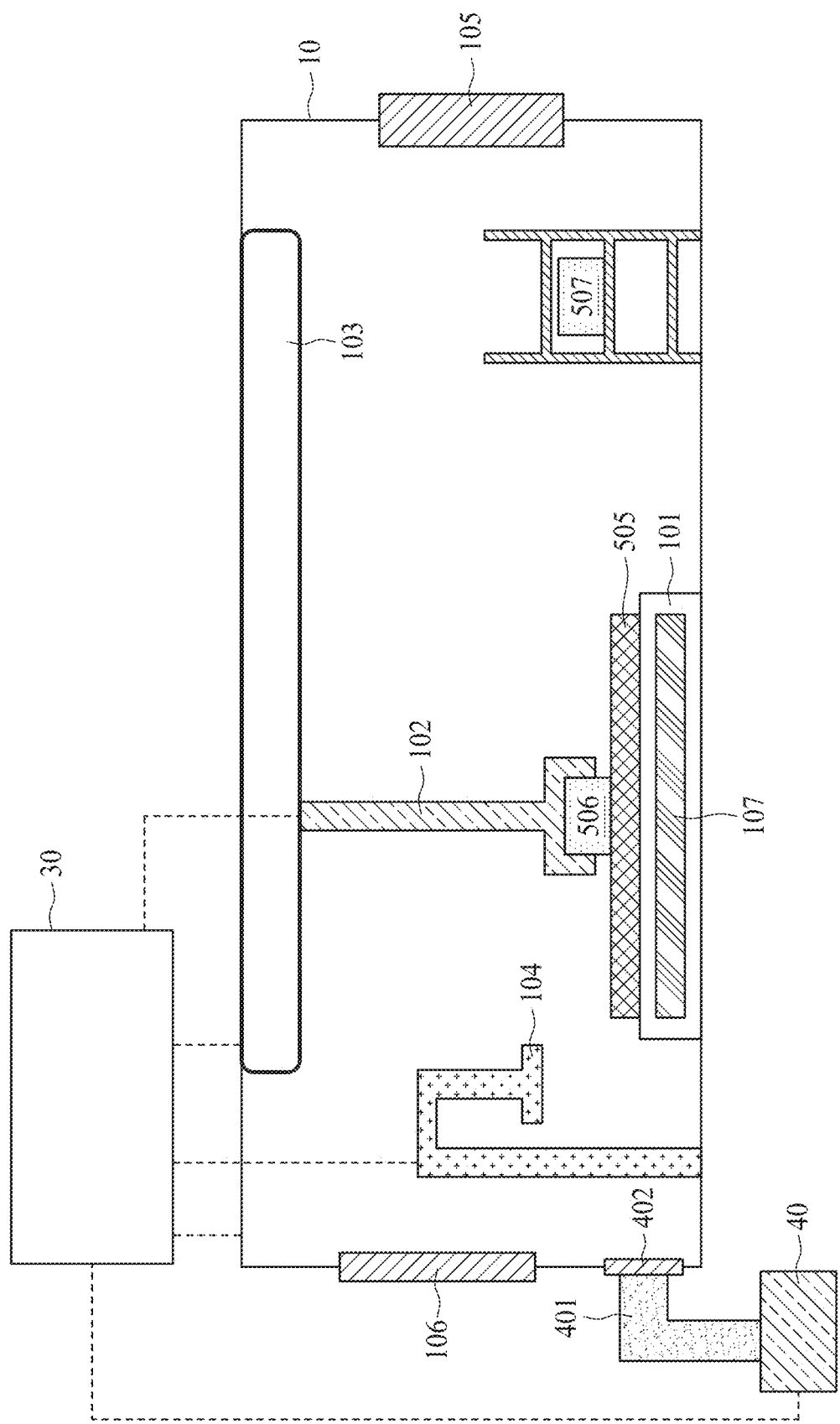
Figure 17:
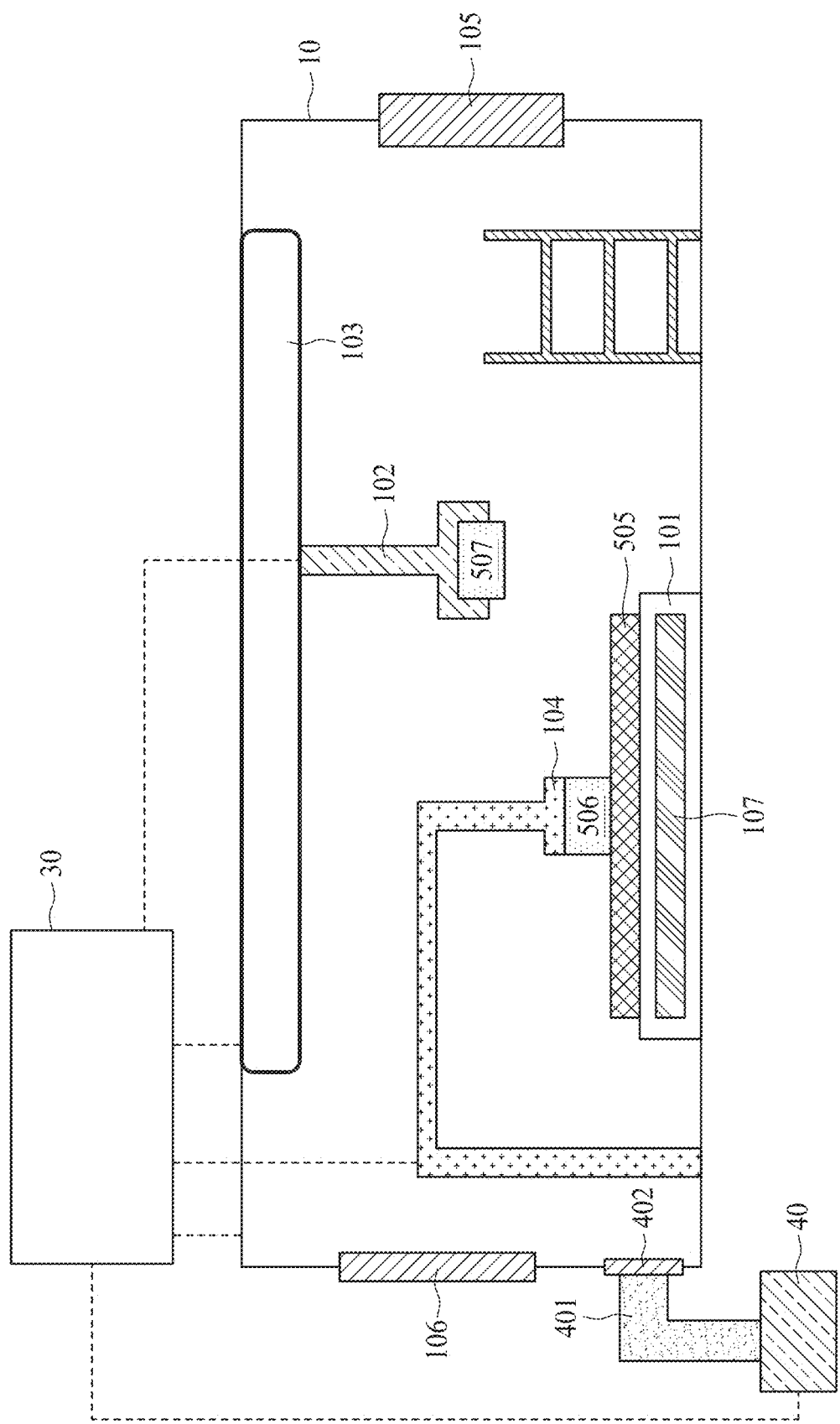

Please refer to FIGS. 16 to 17, which are schematic diagrams in accordance with the operations 704 to 706 of the method 700 according to some embodiments of the present disclosure. In some embodiments, the second semiconductor device 506 is transported toward the first semiconductor device 505 by a machine arm 102 inside the chamber 10 as shown in FIG. 16. In some embodiments, the bonding operation is performed after the second semiconductor device 506 is positioned on the first semiconductor device 505. In some embodiments, one or more voids are formed between the first semiconductor device 505 and the second semiconductor device 506 during the boding operation. In some embodiments, a thermal component 107 is disposed in the chamber 10 and configured to provide thermal energy for the bonding operation. In some embodiments, the thermal component 107 is disposed in the stage 101 for better efficiency of conduction of heat to the first semiconductor device 505 and the second semiconductor device 506. In some embodiments, the thermal component 107 is disposed in the chamber 10 and/or on an inner sidewall of the chamber 10. A position and a number of the thermal component 107 are not limited herein.

In some embodiments, the third semiconductor device 507 on the load-lock type holder 51 is picked up by the machine arm 102 while the bonding operation is performed on the second semiconductor device 506 as shown in FIG. 17. The operations 704 to 706 can be performed on the third semiconductor device 507 during or after the bonding operation of the second semiconductor device 506. In some embodiments, the controller 30 is electrically or signally connected to the machine arm 102, a transmission agency 103, the bonding apparatus 104, the chamber 10, the motor unit 40, and the valves 105, 106 and 402. The controller 30 is configured to control the bonding operation. In some embodiments, opening and closing of the valves 105, 106 and 402, the air pressure in the chamber 10, the temperature of the low-pressure environment during the bonding operation, a duration of the bonding operation, a force provided by the bonding apparatus 104, and the movement of the machine arm 102 are controlled by the controller 30. In some embodiment, the controller 30 receives a feedback signal from the valves 106 and 105 after the closure of the valves 106 and 105, and sends a signal to the motor unit 40 to evacuate air gases from the chamber 10. In some embodiments, the system 801 further includes a sensor (not shown in the figures), which is electrically or signally connected to the controller 30, in the chamber 10. The sensor can detect an air pressure and/or a temperature inside the chamber 10 and can send signals to the controller 30. In some embodiments, the controller 30 sends a signal to the motor unit 30 to stop the evacuation when the air pressure inside the chamber 10 is equal to or less than the first pressure. The first pressure can be adjusted according to different applications. In some embodiments, the first pressure is set to $1 \times 10^3$ Pa. In some embodiments, the first pressure is set to $1 \times 10^{-1}$ Pa.

In some embodiments, the controller 30 includes a central processing unit (CPU). In some embodiments, the controller 30 is a computer.

Figure 18:
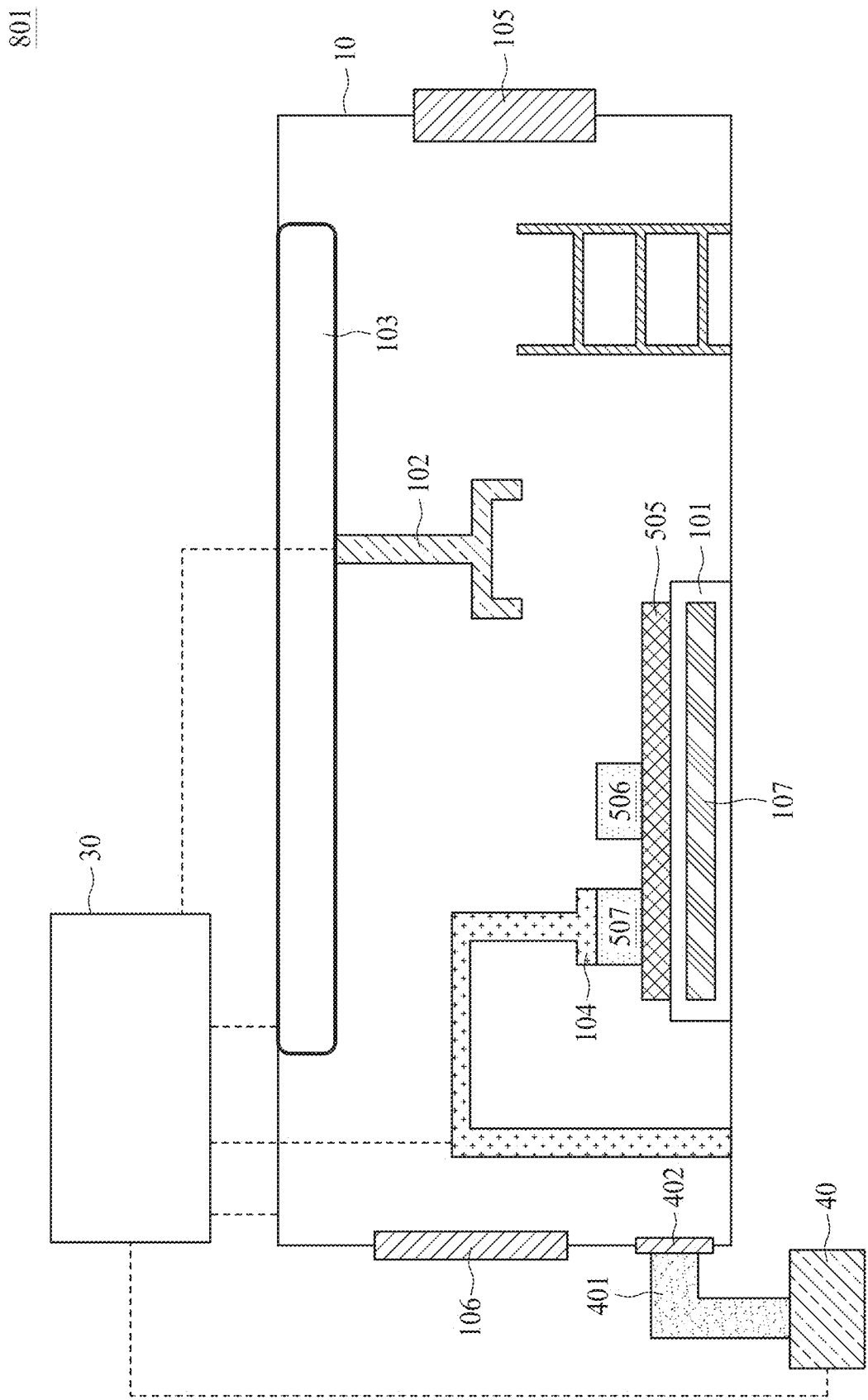

Please refer to FIG. 18, which is a schematic diagram in accordance with the operation 706 of the method 700 according to some embodiments of the present disclosure. In some embodiments, the operation 706 is performed on the third semiconductor device 507 after the bonding operation of the second semiconductor device 506. In some embodiments, one or more voids are formed between the first semiconductor device 505 and the third semiconductor device 507 during the bonding operation. The system 801 may include more than one bonding apparatuses 104, and the operation 706 can be concurrently performed on the second semiconductor device 506 and the third semiconductor device 507.

Figure 19:
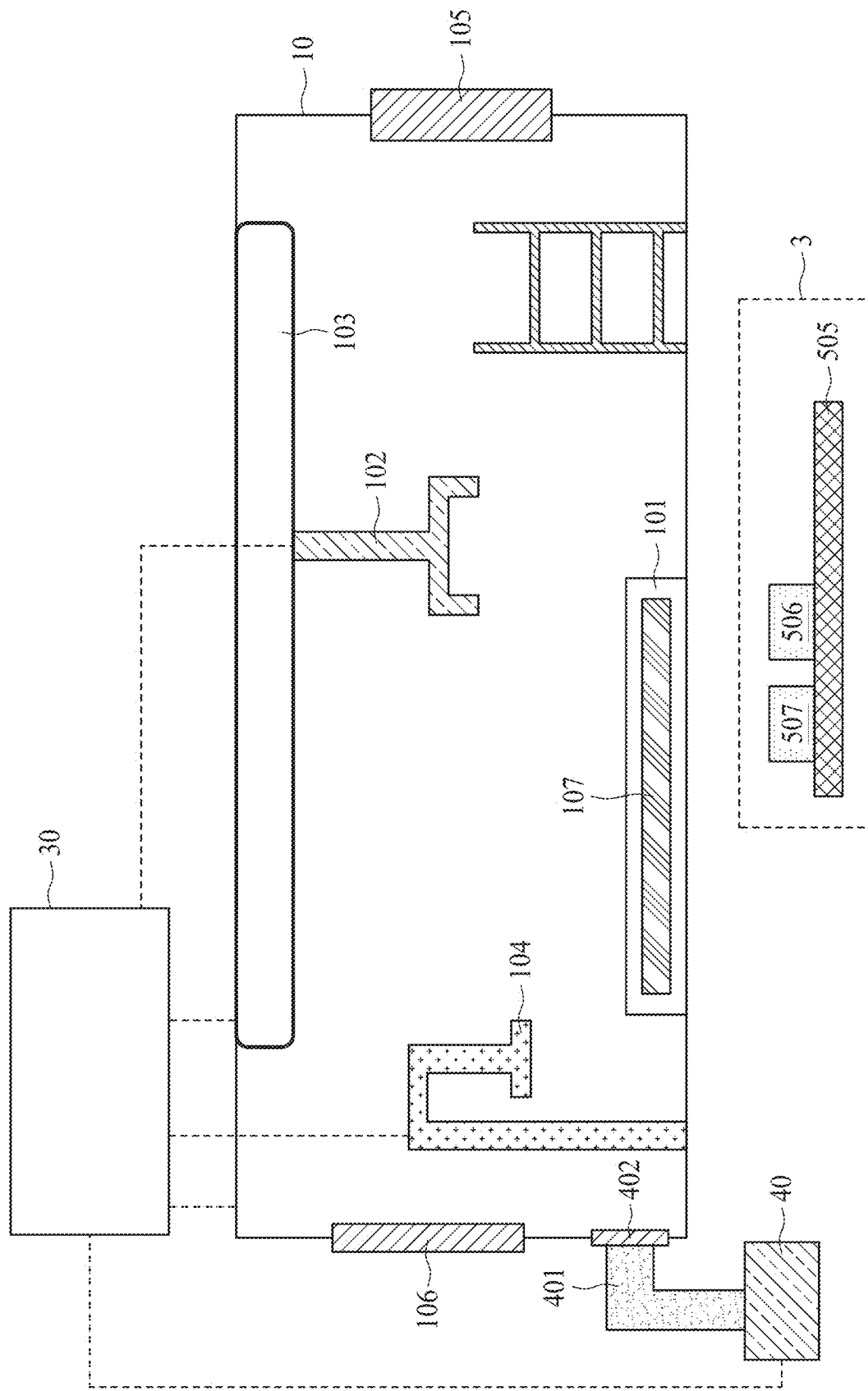

Please refer to FIG. 19, which is a schematic diagram in accordance with the operation 707 of the method 700 according to some embodiments of the present disclosure. In some embodiments, a semiconductor structure of the bonded first, second and third semiconductor devices 505, 506 and 507 is transported out of the chamber 10, and sizes of the voids formed between the first semiconductor devices 505 and the second semiconductor devices 506 and the voids formed between the first semiconductor devices 505 and the third semiconductor devices 507 are reduced.

Figure 20:
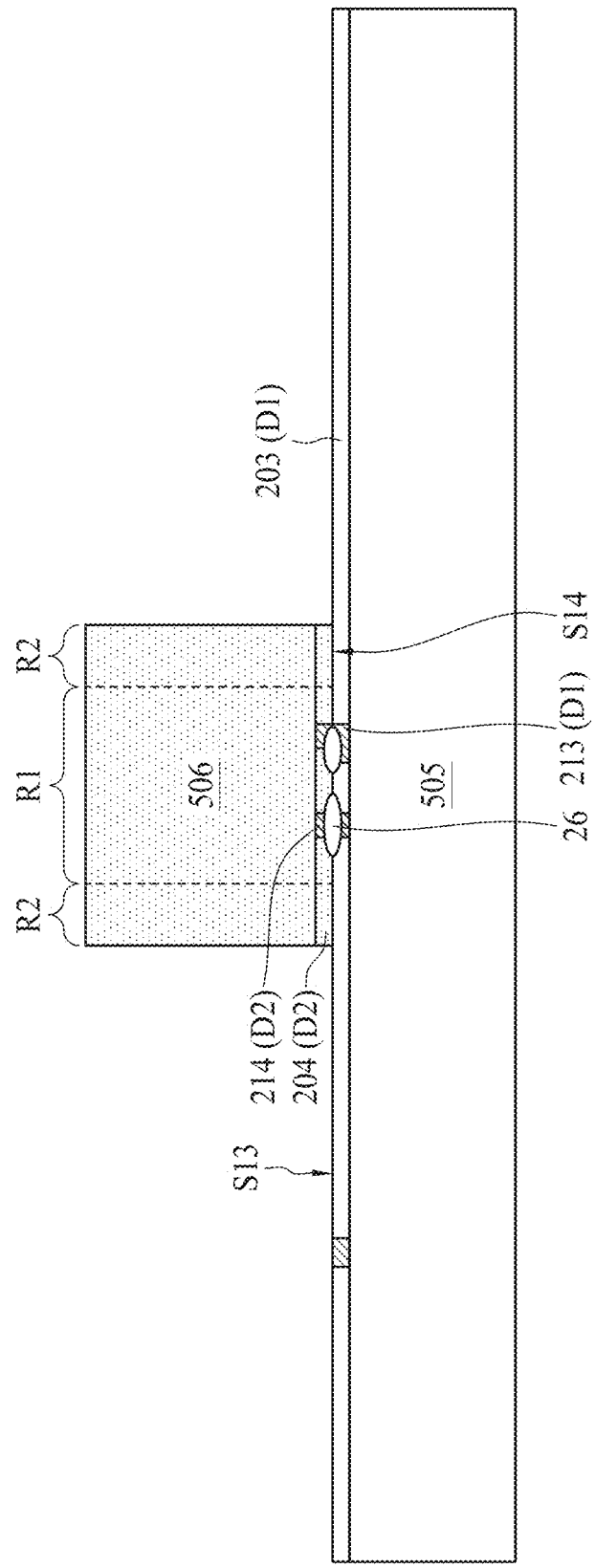
FIGS. 20 to 23 are schematic cross-sectional diagrams of semiconductor devices at different stages of a method for manufacturing a semiconductor structure in accordance with different embodiments of the disclosure.
Figure 21:
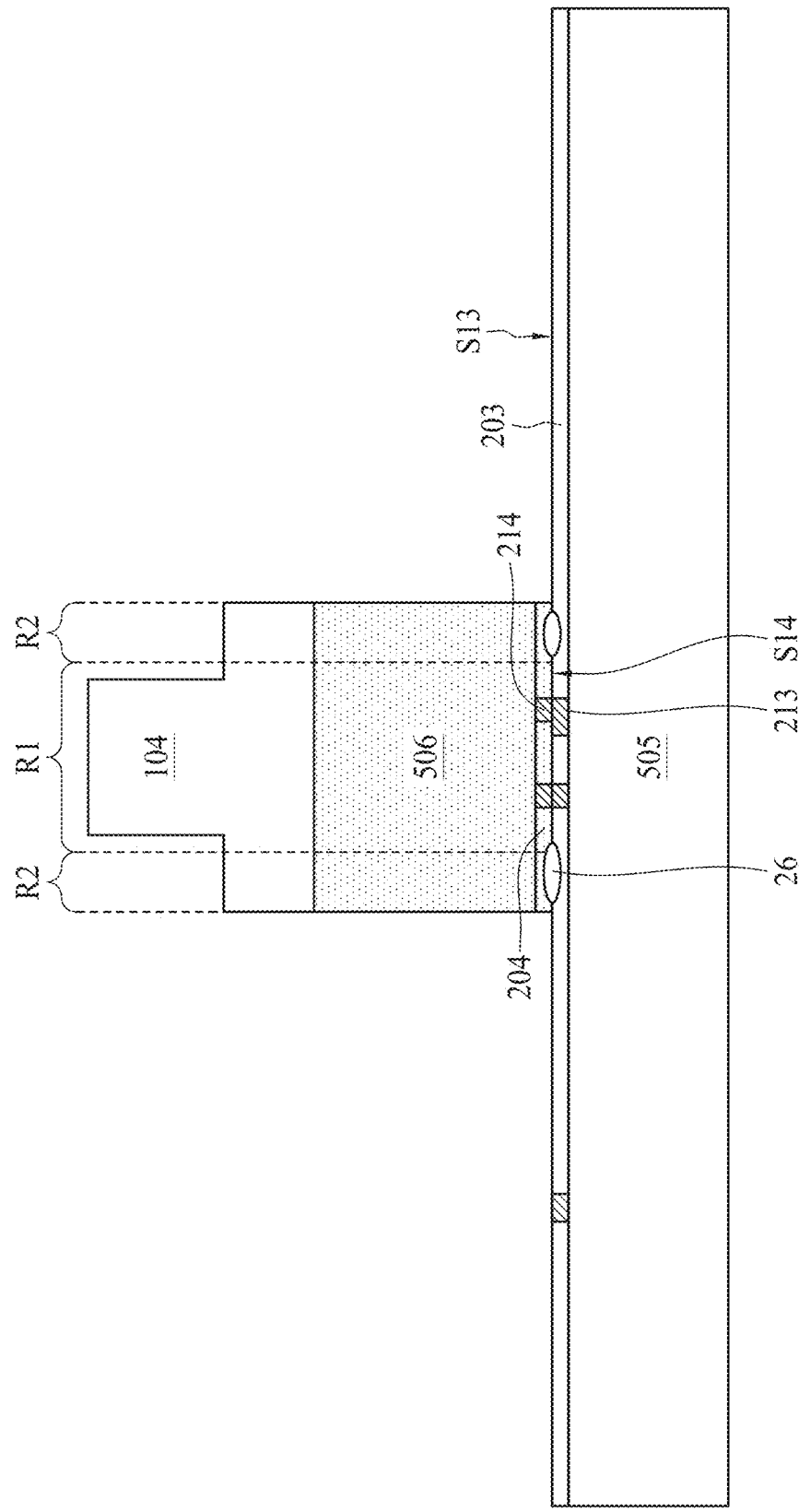

Please refer to FIGS. 20 to 21, which are enlarged schematic diagrams of the first semiconductor device 505 and the second semiconductor device 506 at different stages of the bonding operation in accordance with FIGS. 16 to 17 according to some embodiments of the present disclosure. In some embodiments, the planar surface S13 of the first semiconductor device 505 and the planar surface S14 of the second semiconductor device 506 are bonded. In some embodiments, a conductive material 214 of the planar surface S14 is aligned with and connected to a conductive material 213 of the planar surface S13. In some embodiments, a dielectric material 204 of the planar surface S14 at a peripheral region R2 of the second semiconductor device 506 is fused with a dielectric material 203 of the planar surface S13, and one or more voids 26 are formed between the second semiconductor device 506 and the first semiconductor device 505. The bonding operation and the void formation can be similar to some embodiments of the method 600 as described above, and detailed description is omitted herein. The fusion at the peripheral region R2 may happen prior to fusion at the central region R1 as described above. The voids 26 are pushed toward the peripheral region R2 of the second semiconductor device 506 by a force from the bonding apparatus 104 and are stopped at the peripheral region R2 due to fusion of the dielectric materials 204 and 203 at the peripheral region R2 of the second semiconductor device 506. Electrical connections between the second semiconductor device 506 and the first semiconductor device 505 are mostly in the central region R1, and electrical disconnection caused by the voids 26 can be mostly prevented. However, in some embodiments, the voids 26 are partially in the central region R1 as shown in FIG. 21, and it can result in defect of disconnections. Sizes of the voids 26 are reduced in the subsequent processing in order to further prevent defects of disconnection, thereby improving product yield.

Figure 22:
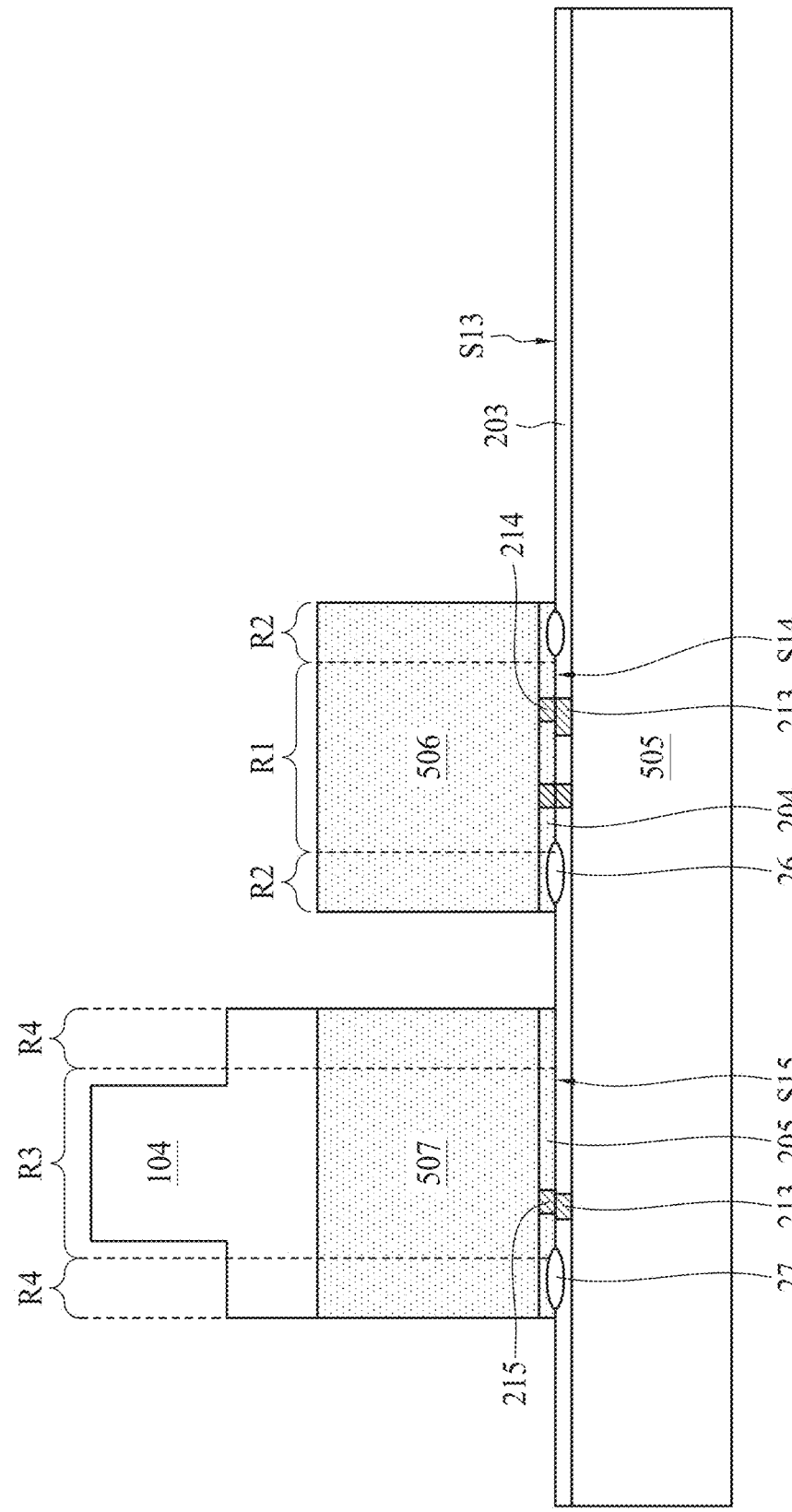

Please refer to FIG. 22, which is an enlarged schematic diagram of the first, second, and third semiconductor devices 505, 506 and 507 at a stage as shown in FIG. 18. Similar to the bonding operation of the second semiconductor device 506, a planar surface S15 of the third semiconductor device 507 is bonded to the planar surface S13 of the first semiconductor device 505. In some embodiments, a conductive material 215 of the planar surface S15 is aligned with and connected to the conductive material 213 of the planar surface S13. In some embodiments, a dielectric material 205 of the planar surface S15 at a peripheral region R4 of the third semiconductor device 507 is fused with the dielectric material 203, and one or more voids 27 are formed between the third semiconductor device 507 and the first semiconductor device 505. The voids 27 are pushed toward the peripheral region R2 of the second semiconductor device 506 by a force from the bonding apparatus 104 and are stopped at the peripheral region R2 due to fusion of the dielectric materials 204 and 203 at the peripheral region R2 of the second semiconductor device 506. In some embodiments, electrical connections between the third semiconductor device 507 and the first semiconductor device 505 are mostly or all disposed in a central region R3 of the third semiconductor device 507.

Figure 23:
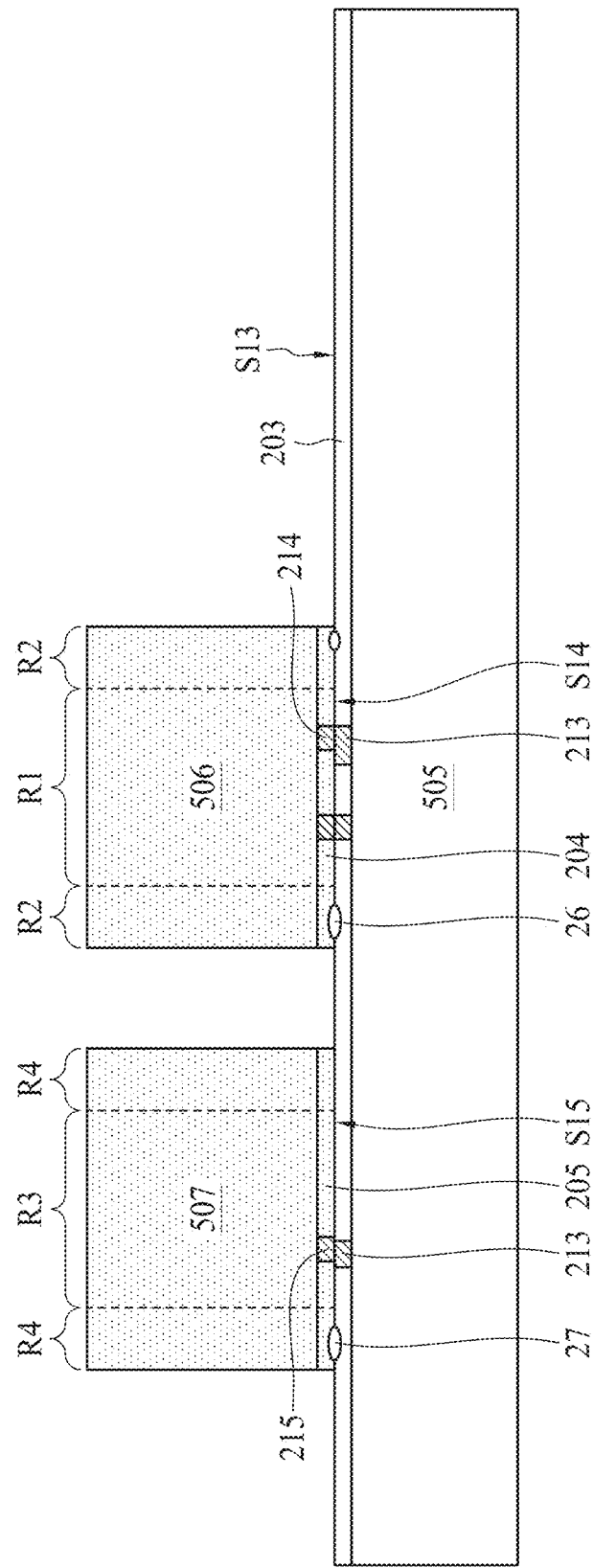

Please refer to FIG. 23, which is an enlarged schematic diagram of the semiconductor structure 3 at the stage in accordance with FIG. 19 according to same embodiments of the present disclosure. Sizes of the voids 26 and the void 27 are reduced. In some embodiments, the voids 26 are entirely disposed in the peripheral region R2 of the second semiconductor device 506. In some embodiments, the void 27 is entirely disposed in the peripheral region R4 of the third semiconductor device 507.

According to the concept of the invention as described above, the disclosure further provides different systems for performing the method 600 or the method 700. FIGS. 24 to 33 are schematic diagrams of different systems in accordance with different embodiments of the present disclosure.

Figure 24:
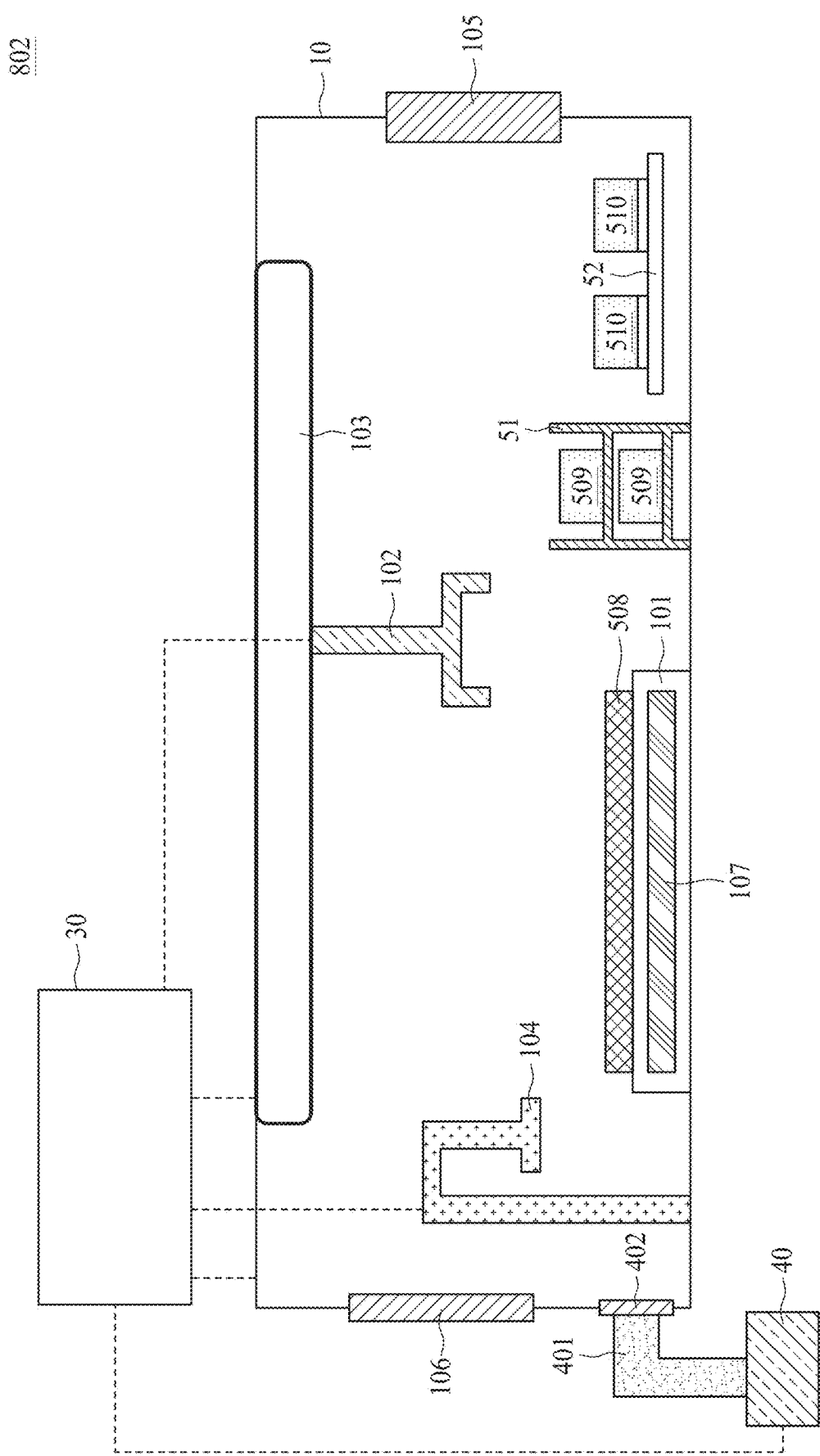
FIGS. 24 to 33 are schematic diagrams of a system for manufacturing a semiconductor structure in accordance with different embodiments of the present disclosure.

FIG. 24 is a schematic diagram of a system 802 in accordance with some embodiments of the present disclosure. In some embodiments, the system 802 has a configuration and a function similar to those of the system 801, except that the system 802 is for performing chip-on-wafer bonding operations and die-on-wafer bonding operations. A wafer 508 is disposed on a stage 101, and chips 509 and dies 510 are disposed in a chamber 10 ready for a bonding operation. In some embodiments, the chamber 10 of the system 802 is configured to accommodate different types of holders. In some embodiments, the chips 509 are disposed on a load-lock type holder 51 in the chamber 10. In some embodiments, the dies 510 are disposed in a frame-type holder 52 in the chamber 10. It should be noted that the chips 509 in other embodiments can be referred to as dies 509, and dies 510 in other embodiments can be referred to as chips 510. For ease of description, the semiconductor devices held by the load-lock type holder 51 are referred to as chips, and semiconductor devices held by the frame-type holder 52 are referred to as dies in this disclosure, but the disclosure is not limited thereto.

Figure 25:
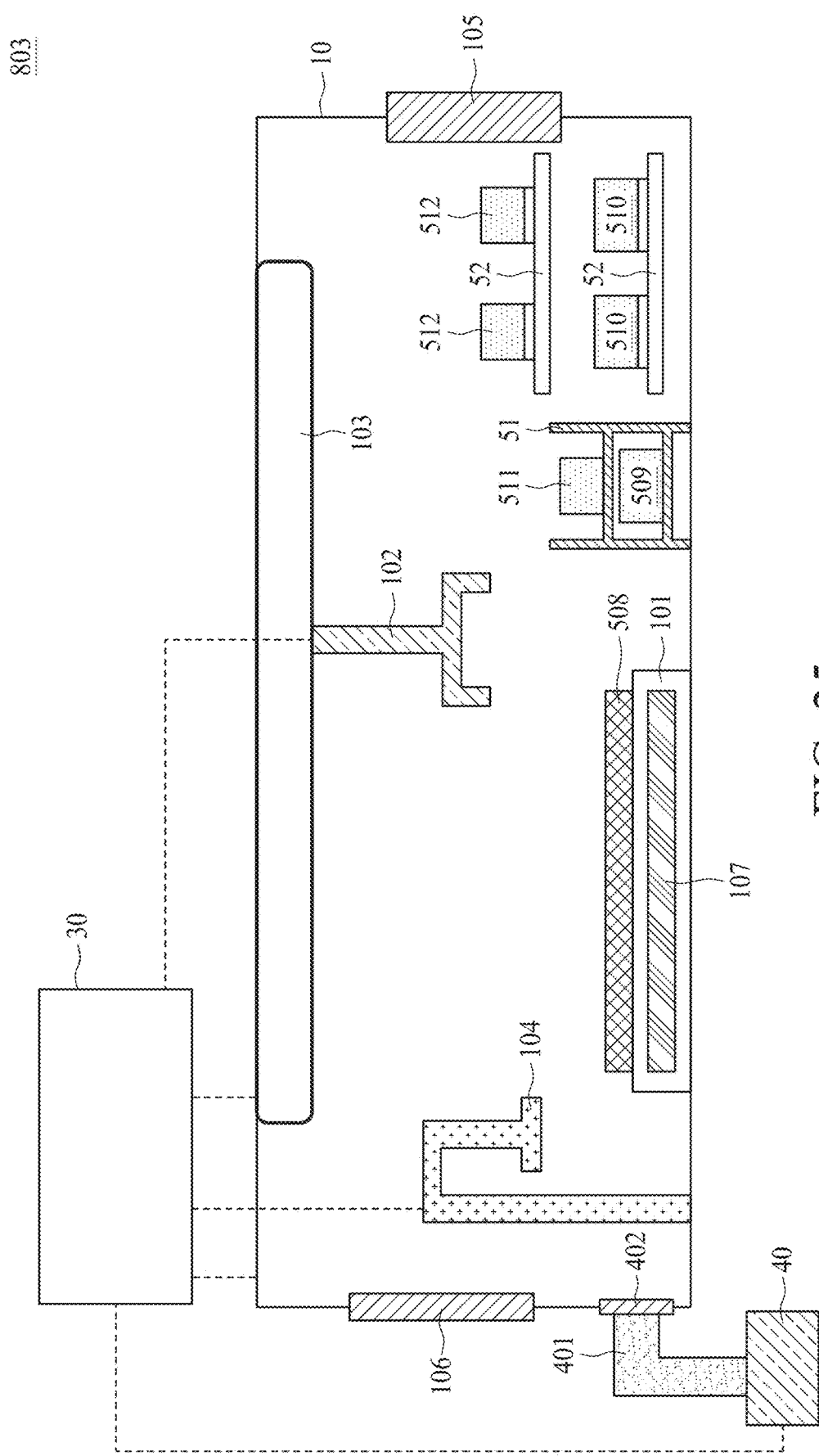

FIG. 25 is a schematic diagram of a system 803 in accordance with some embodiments of the present disclosure. In some embodiments, the system 803 has a configuration and a function similar to those of the system 802, except that the system 803 is configured to perform bonding operations on chips or dies with different dimensions. In some embodiments, a chip 511 and a chip 509 having different dimensions are disposed on a load-lock type holder 51, and dies 512 and dies 510 having different dimensions are disposed in different frame-type holders 52 with sizes corresponding to the dies 512 and dies 510.

Figure 26:
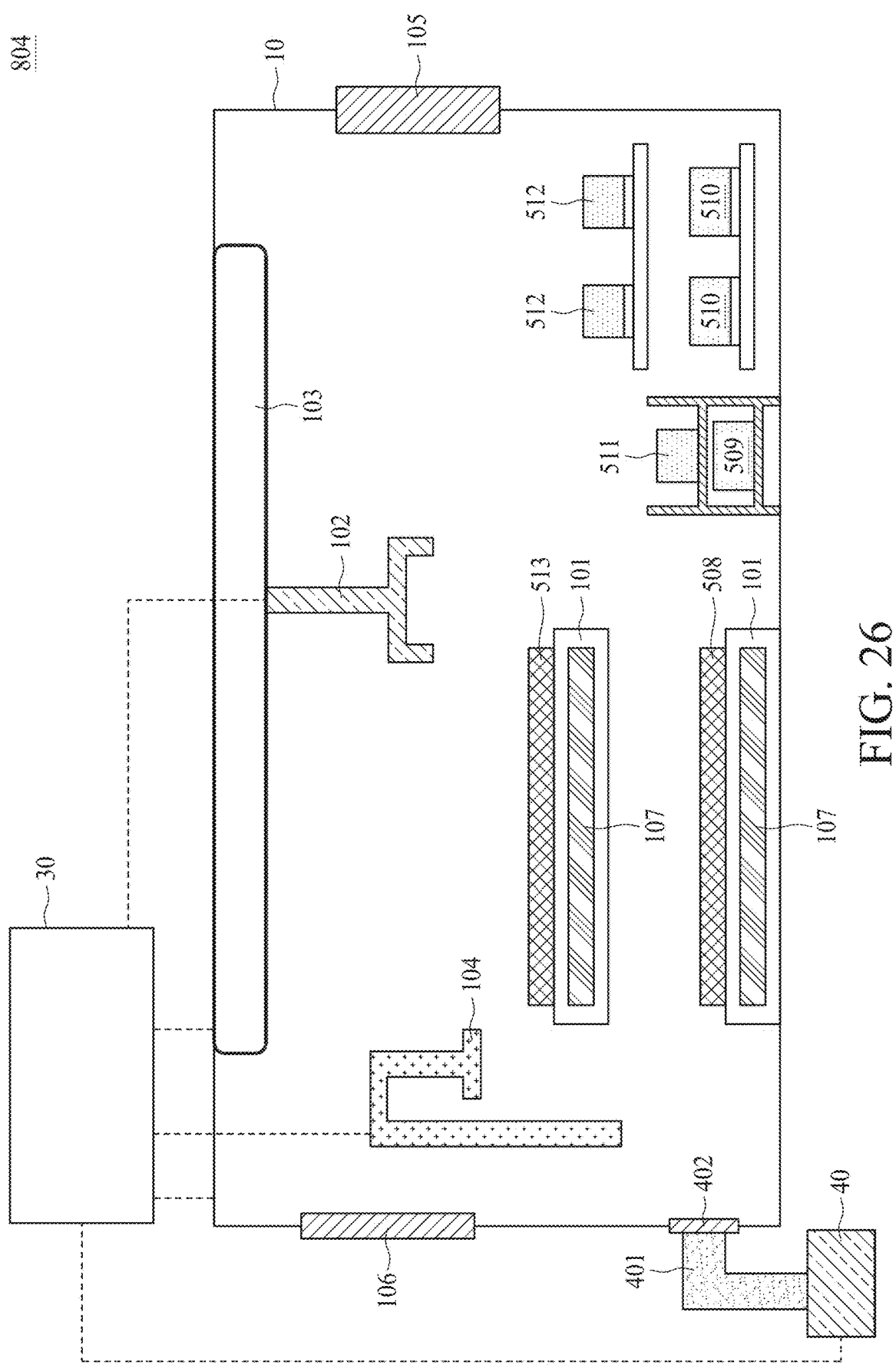

FIG. 26 is a schematic diagram of a system 804 in accordance with some embodiments of the present disclosure. In some embodiments, the system 804 has a configuration and a function similar to those of the system 803, except that the system 804 is configured to perform bonding operations on different wafers 508 and 513 concurrently. In some embodiments, chips 511 and 509 and dies 510 and 512 individually are arranged to be bonded to the wafer 508 or the wafer 513. In some embodiments, the system 804 includes multiple bonding apparatuses 104 and/or multiple machine arms 102 for transportation and bonding operations of the chips 511 and 509 and dies 510 and 512.

Figure 27:
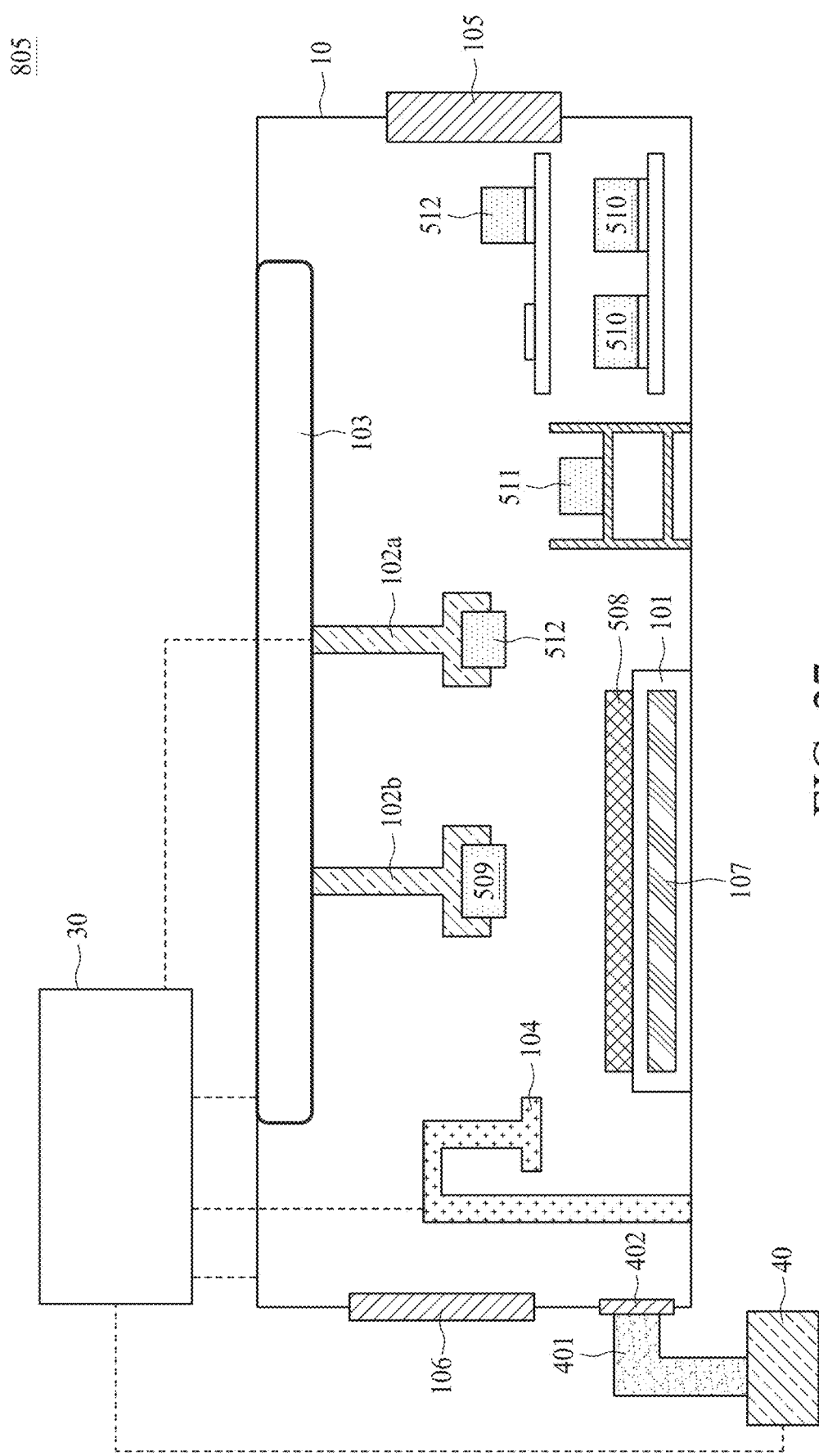

FIG. 27 is a schematic diagram of a system 805 in accordance with some embodiments of the present disclosure. In some embodiments, the system 805 has a configuration and a function similar to those of the system 803, except that the system 805 includes multiple machine arms 102a and 102b. In some embodiments, the machine arms 102a and 102b are configured to transport different sizes of chips or dies.

Figure 28:
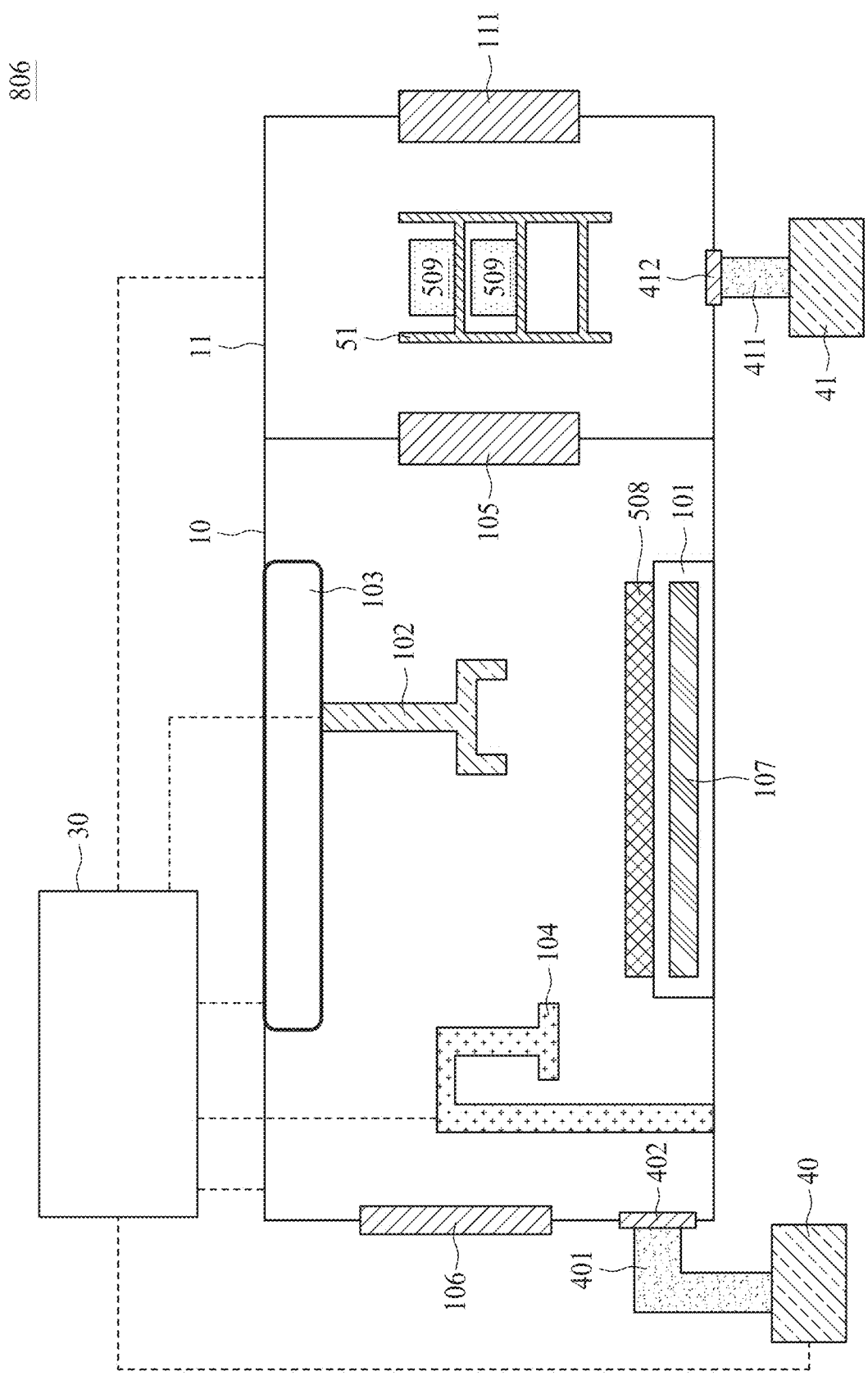

FIG. 28 is a schematic diagram of a system 806 in accordance with some embodiments of the present disclosure. In some embodiments, the system 806 has a configuration and a function similar to those of the system 801, except that the system 806 includes a chamber 11 connected to a chamber 10 and a motor unit 41 connected to the chamber 11. The chamber 11 may include a valve 111 on a sidewall for transportation of semiconductor devices to be bonded (e.g., chips 509) into and out of the chamber 11, and the chamber 11 may further include a load-lock type holder (e.g., 51) for holding the semiconductor devices. In some embodiments, the chips 509 and the load-lock type holder 51 are disposed in the chamber 11 prior to the bonding operation. In some embodiments, the chips 509 are moved in the chamber 11 in the operation 602 of the method 600 or prior to the operation 704 of the method 700. In some embodiments, gas molecules in the chamber 11 are evacuated by the motor unit 41. In some embodiments, the motor unit 41 includes a conduit 411 extending to and connected to a valve 412 on an inner sidewall of the chamber 11. In some embodiments, the valve 412 is electrically or signally connected to a controller 30, and a state (e.g., open or closed) of the valve 412 can be controlled by the controller 30. In some embodiments, the controller 30 is electrically or signally connected to the chamber 11, thereby controlling the valve 412. In some embodiments, the motor unit 41 can be a turbo pump, an ion pump or a cryo pump. The chamber 11 functions as a buffer chamber so that less air can enter the chamber 10 while the valve 105 is opened. In some embodiments, the chamber 11 is configured to provide a low-pressure environment, which may have an air pressure greater than that of the low-pressure environment in the chamber 10. In some embodiments, the air pressure inside the chamber 11 is substantially equal to or less than $1 \times 10^3$ Pa, and the air pressure inside the chamber 10 is substantially equal to or less than $1 \times 10^{-1}$ Pa. In some embodiments, the motor unit 41 stops when the air pressure inside the chamber 11 is substantially equal to or less than $1 \times 10^3$ Pa. In some embodiments, the air pressure of the chamber 11 can be reduced by the motor unit 41 prior to or after the chips 509 are disposed in the chamber 11.

Figure 29:
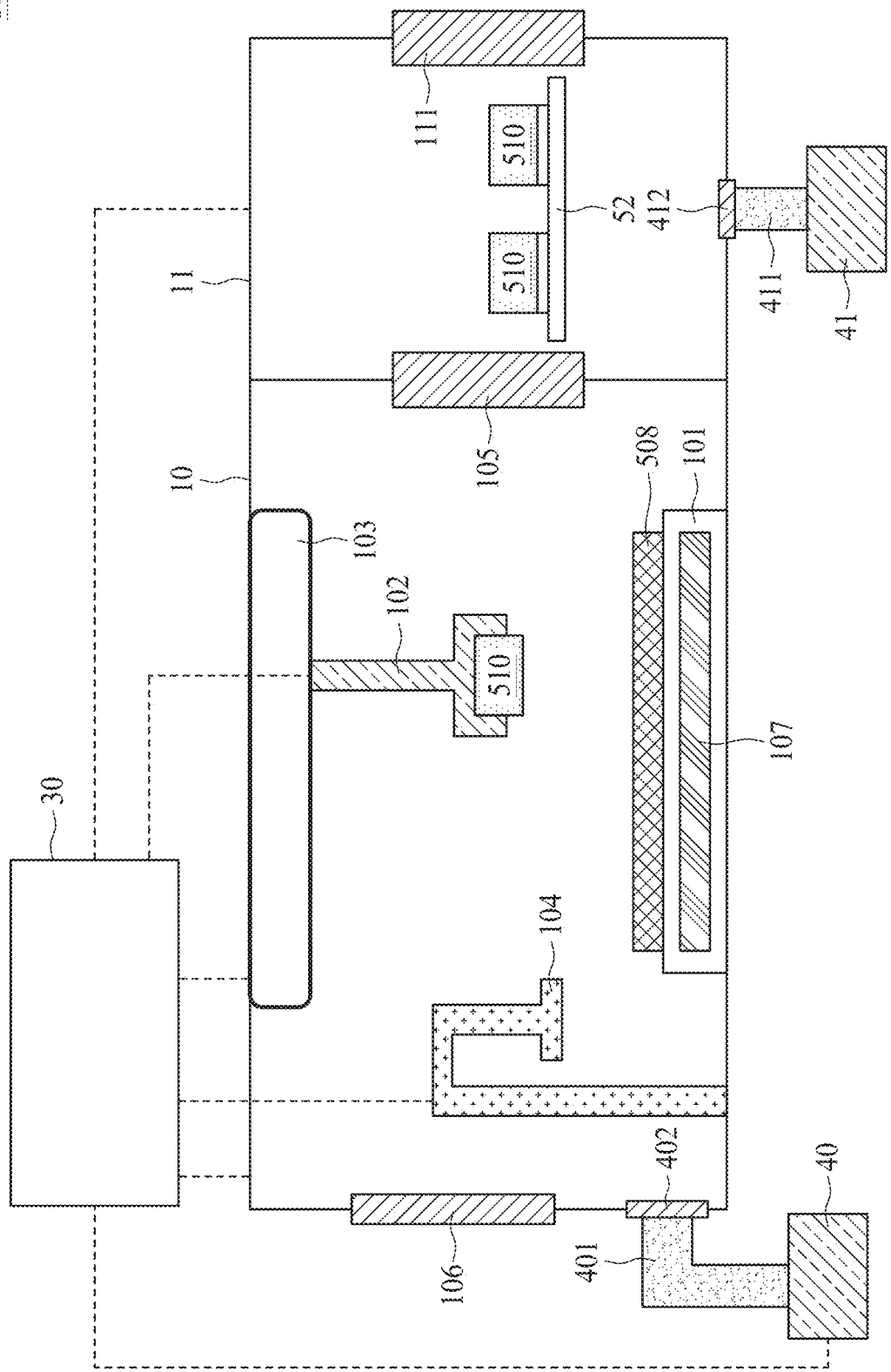

FIG. 29 is a schematic diagram of a system 807 in accordance with some embodiments of the present disclosure. In some embodiments, the system 807 has a configuration and a function similar to those of the system 806, except that a chamber 11 is configured for placing dies 510 in a frame-type holder 52.

Figure 30:
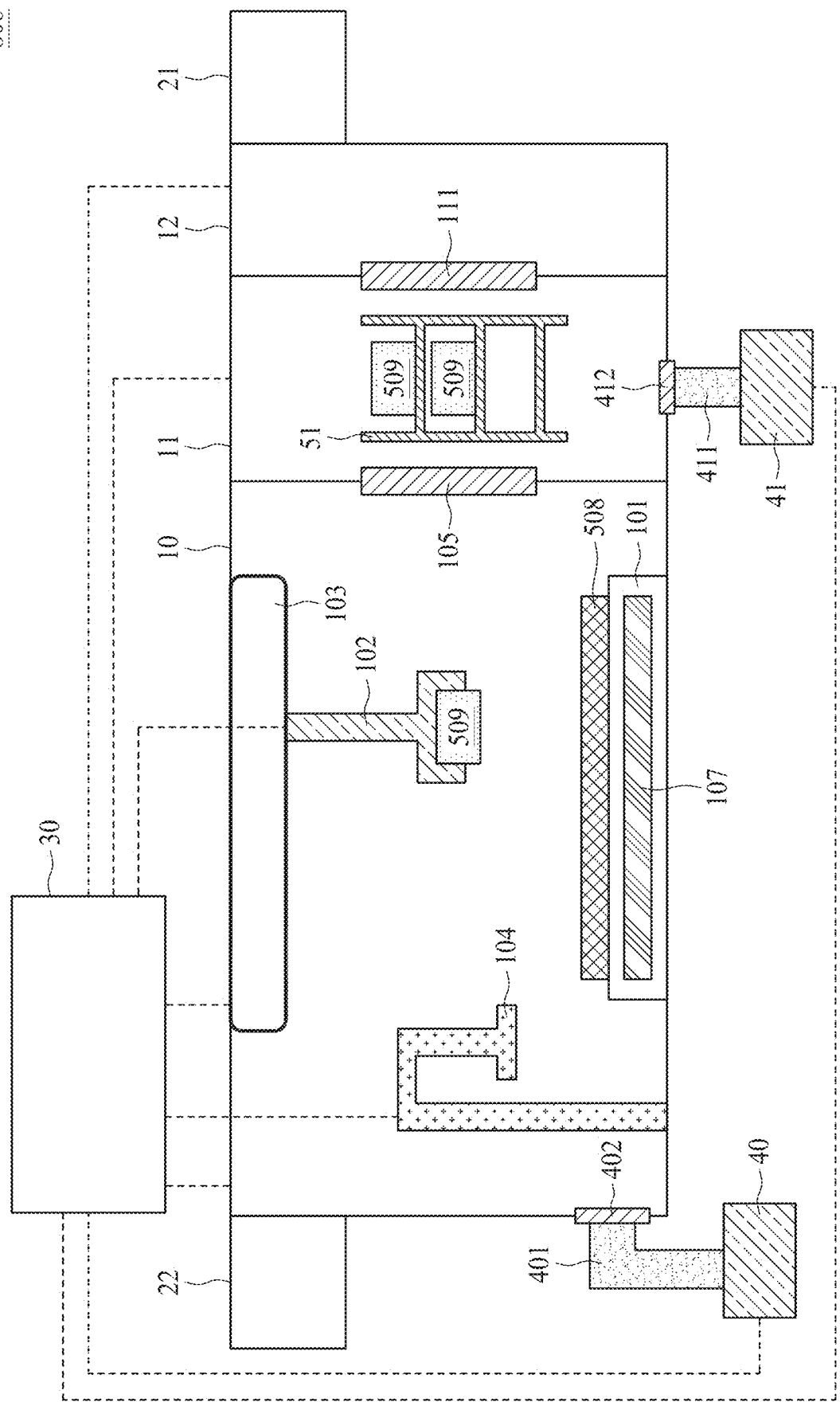

FIG. 30 is a schematic diagram of a system 808 in accordance with some embodiments of the present disclosure. In some embodiments, the system 808 has a configuration and a function similar to those of the system 806, except that the system 808 further includes a wafer load port 22, a chip or die load port 21, and a chamber 12. The chamber 12 may be connected to the chamber 11, and chips 509 can be transported between the chamber 11 and the chamber 12 through the valve 111. In some embodiments, the chamber 12 provides a space for disposing more chips or dies to be bonded. In some embodiments, the chamber 12 is not connected to a motor unit or other gas-evacuating apparatus. In some embodiments, the chip or die load port 21 is connected to the chamber 12. In some embodiments, the system 808 can include more than one chip or die load port 21. In some embodiments, the wafer load port 22 is connected to the chamber 10. In some embodiments, transportation of a wafer 508 into the chamber 10 and transportation of a semiconductor structure (having bonded semiconductor devices) out of the chamber 10 are performed by passing the semiconductor structure through the wafer load port 22. In some embodiments, the system 808 can include more than one wafer load port 22.

Figure 31:
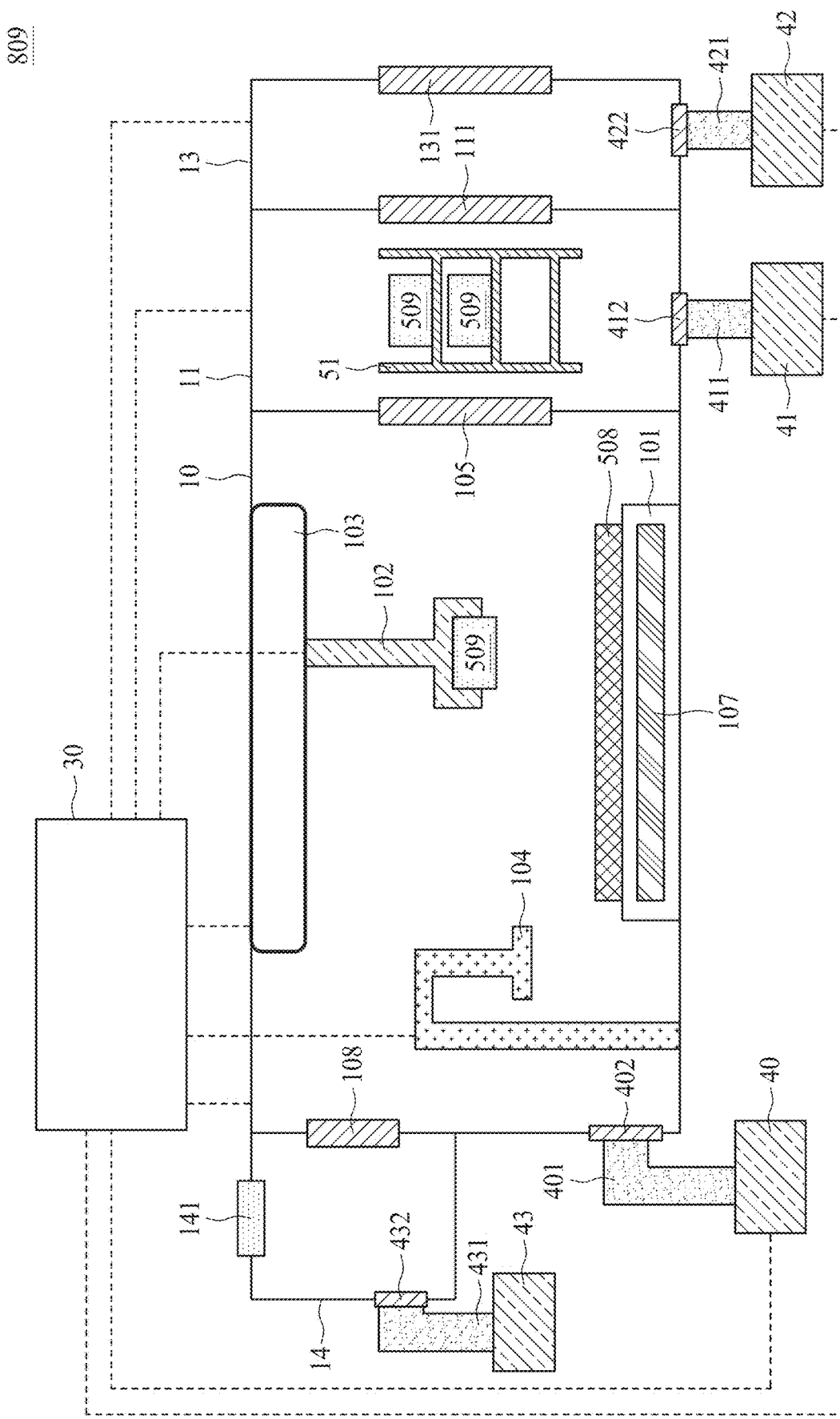

FIG. 31 is a schematic diagram of a system 809 in accordance with some embodiments of the present disclosure. In some embodiments, the system 809 has a configuration and a function similar to those of the system 806, except that the system 809 further includes a chamber 13 connected to a chamber 11, a motor unit 42 connected to the chamber 13, a chamber 14 connected to a chamber 10, and a motor unit 43 connected to the chamber 14. In some embodiments, the chamber 13 functions as a secondary buffer chamber (the chamber 11 functions as a primary buffer chamber). The chamber 13 includes a valve 131, and chips 509 and a load-lock type holder 51 are transported into the chamber 13 through the valve 131. An air pressure of the chamber 13 may be greater than an air pressure of the chamber 11, which may be greater than an air pressure of the chamber 10. The motor unit 42 is configured to evacuate air gases from the chamber 13 in order to reduce the air pressure inside the chamber 13. In some embodiments, the motor unit 42 includes a conduit 421 extending to and connected to a valve 422 on an inner sidewall of the chamber 13. The chamber 13, the motor unit 42 and the valve 422 may be directly or indirectly connected to the controller 30 electrically or signally.

In some embodiments, the chamber 14 functions as a buffer chamber for wafers to be bonded to chips or dies. In some embodiments, functions of the chamber 14 can be similar to those of the chamber 11 as described above in other embodiments, except that the chamber 14 is configured to accommodate wafers but not chips, dies, or chip/die holders. In some embodiments, the motor unit 43 includes a conduit 431 extending to and connected to a valve 432 on an inner sidewall of the chamber 13. The chamber 14, the motor unit 43 and the valve 432 may be directly or indirectly connected to a controller 30 electrically or signally. An air pressure of the chamber 14 is controlled to be greater than the air pressure of the chamber 10. In some embodiments, the air pressure inside the chamber 14 is substantially equal to or less than $1 \times 10^3$ Pa, and an air pressure inside the chamber 10 is substantially equal to or less than $1 \times 10^{-1}$ Pa. In some embodiments, a wafer 508 is transported into the chamber 14 through a valve 141 and then into the chamber 10 through a valve 108.

Figure 32:
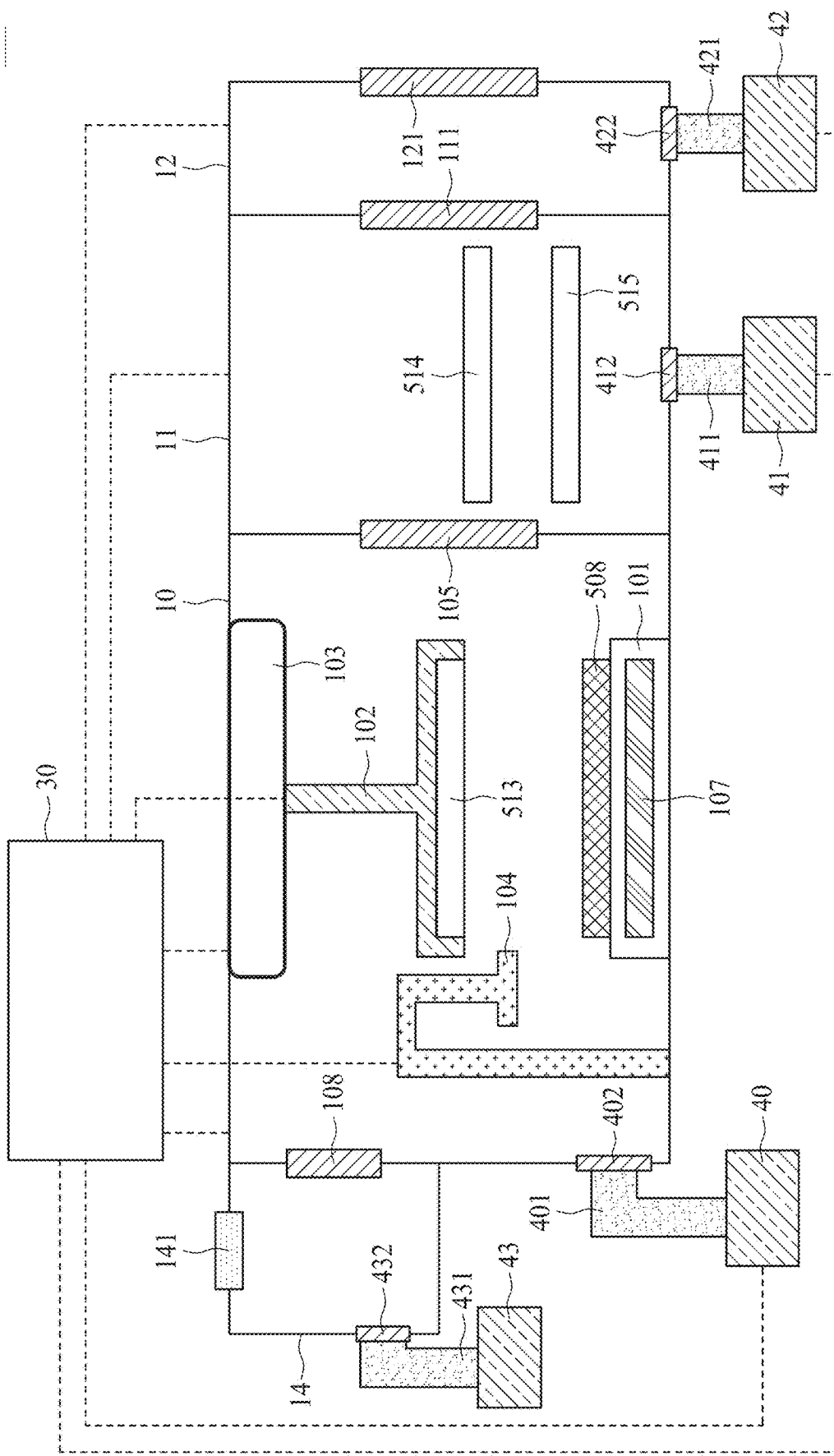

FIG. 32 is a schematic diagram of a system 810 in accordance with some embodiments of the present disclosure. In some embodiments, the system 810 has a configuration and a function similar to those of the system 809, except that the system 810 is configured to perform wafer-to-wafer bonding operations, and the system 809 is configured to perform chip-on-wafer or die-on-wafer bonding operations. In some embodiments, wafers 514 and 515 are disposed in a chamber 11 for bonding operations performed after a bonding operation performed on a wafer 513 in a chamber 10. In some embodiments, the wafers 514 and 515 in the chamber 11 can have same or different dimensions.

Figure 33:
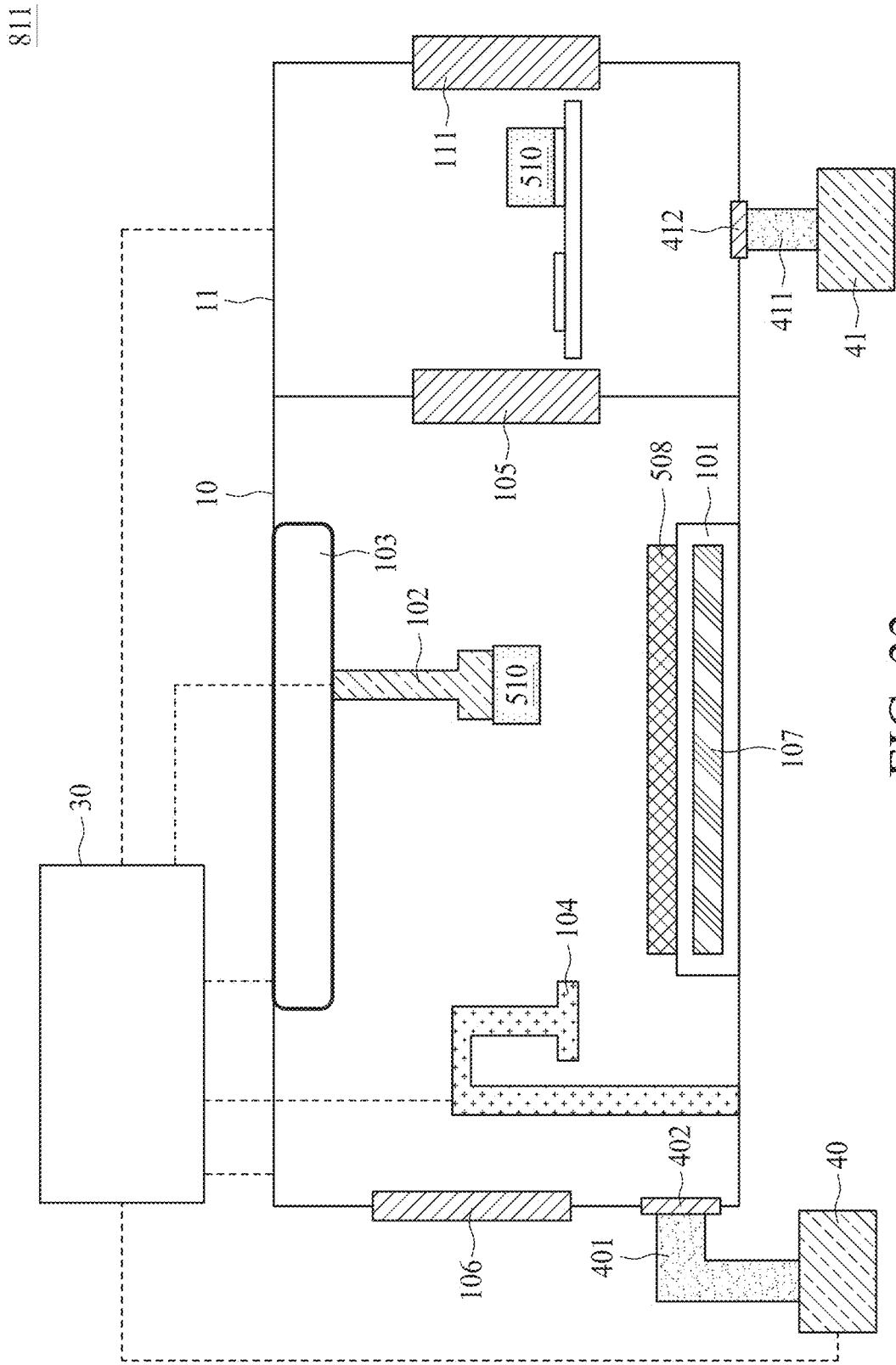

FIG. 33 is a schematic diagram of a system 811 in accordance with some embodiments of the present disclosure. In some embodiments, the system 811 has a configuration and a function similar to those of the system 807, except that a machine arm 102 is a suction-type arm rather than a grabbing-type arm as in the embodiments described above. In order to transport a chip 510, an air pressure between the chip 510 and the machine arm 102 is reduced to a pressure lower than an air pressure of a chamber 10, and the chip 510 is thereby lifted and transported by the machine arm 102 toward a wafer 508 on a stage 101. In some embodiments, the chip 510 is positioned on the wafer 508, and the air pressure between the chip 510 and the machine arm 102 is increased to a pressure substantially equal to the air pressure of the chamber 10. The chip 510 is therefore released from the machine arm 102 and disposed on the wafer 508. It should be noted a sucking-type machine arm, a grabbing-type machine arm or a combination thereof can be applied to all embodiments of the present disclosure, and is not limited herein.

The present disclosure provides methods and systems for forming semiconductor structures, especially those formed in hybrid bonding operations. A force is provided from a central region toward a peripheral region of an upper device (wherein the upper device usually has a dimension smaller than that of a lower device) to prevent disconnections in the central region with a higher connection density. However, it is nearly impossible to eliminate every one of a plurality of voids at a bonding interface of two bonded devices. Therefore, the bonding operations are performed in a low-pressure environment according to the disclosure, which can lead to reduction in sizes of the voids at the bonding interface. Sizes and positions of the voids can be controlled according to the method of the disclosure, thereby preventing disconnections between the two bonded devices, and product yield can be thereby improved.

In accordance with some embodiments of the disclosure, a method for bonding semiconductor devices is provided. The method may include several operations. A wafer and a chip are formed. The wafer and the chip are disposed in a low-pressure environment. A planar surface of the chip is moved toward a planar surface of the wafer. A void is formed between the planar surface of the chip and the planar surface of the wafer. The chip is bonded to the wafer. A bonded structure of the chip and the wafer is disposed under a standard atmosphere. A size of the void is reduced.

In accordance with some embodiments of the disclosure, a method for forming a semiconductor structure is provided. The method may include several operations. A first semiconductor device and a second semiconductor device are formed. The first semiconductor device is moved into a first chamber. An air pressure of the first chamber is reduced to a first pressure. The second semiconductor device is moved toward the first semiconductor device in the first chamber. A first planar surface of the first semiconductor device is bonded to a second planar surface of the second semiconductor device, wherein the first planar surface includes a first dielectric material and a first conductive material, and the second planar surface includes a second dielectric material and a second conductive material. A void is formed between the first semiconductor device and the second semiconductor device. A bonded structure of the first semiconductor device and the second semiconductor device is moved out of the first chamber, thereby reducing a size of the void.

In accordance with some embodiments of the disclosure, a system for forming a semiconductor structure is provided. The system includes a first chamber, a second chamber, a controller, and a first pump. The first chamber is configured to provide a first low-pressure environment for a hybrid bonding operation. The second chamber is connected to the first chamber and configured to provide a second low-pressure environment having a pressure greater than that of the first low-pressure environment. The controller is configured to control the hybrid bonding operation. The first pump is connected to a first valve disposed on an inner sidewall of the first chamber, and is configured to remove air from the first chamber prior to or during the hybrid bonding operation.

The foregoing outlines features of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for bonding semiconductor devices, comprising:
    forming a wafer and a chip;
    disposing the wafer and the chip in a low-pressure environment;
    moving a planar surface of the chip toward a planar surface of the wafer;
    forming a void between the planar surface of the chip and the planar surface of the wafer;
    bonding the chip to the wafer;
    providing a force on the chip, thereby moving the void from a central region of the chip toward a peripheral region of the chip;
    disposing a bonded structure of the chip and the wafer under a standard atmosphere; and
    reducing a size of the void.

2. The method of claim 1, wherein the void is at the peripheral region of the chip prior to the disposing the bonded structure of the chip and the wafer under the standard atmosphere.

3. The method of claim 1, wherein the planar surface of the chip includes a first dielectric material, the planar surface of the wafer includes a second dielectric material, and the void is defined by the first dielectric material and the second dielectric material.

4. The method of claim 3, wherein the forming of the void includes:
    causing the first dielectric material at the peripheral region of the chip to contact the second dielectric material; and
    causing the first dielectric material at the central region of the chip to contact the second dielectric material after the contacting of the first dielectric material at the peripheral region of the chip with the second dielectric material.

5. The method of claim 1, wherein an air pressure of the low-pressure environment is less than $1\times10^3$ Pascal (Pa).

6. A method for forming a semiconductor structure, comprising:
    forming a first semiconductor device and a second semiconductor device;
    moving a first semiconductor device into a first chamber;
    reducing an air pressure of the first chamber to a first pressure;
    moving the second semiconductor device toward the first semiconductor device;
    bonding a first planar surface of the first semiconductor device to a second planar surface of the second semiconductor device;
    forming a void between the first semiconductor device and the second semiconductor device;
    moving the void toward a peripheral region of the second semiconductor device; and
    moving a bonded structure of the first semiconductor device and a second semiconductor device out of the first chamber, thereby reducing a size of the void.

7. The method of claim 6, further comprising:
    moving the second semiconductor device into a second chamber; and
    reducing an air pressure of the second chamber to a second pressure.

8. The method of claim 7, wherein the second pressure is greater than the first pressure.

9. The method of claim 8, wherein the first pressure is substantially equal to or less than $1\times10^{-1}$ Pascal (Pa), and the second pressure is substantially equal to or less than $1\times10^3$ Pa.

10. The method of claim 6, wherein a first dimension of the first semiconductor device is different from a second dimension of the second semiconductor device.

11. The method of claim 6, wherein the first semiconductor device includes a wafer, and the second semiconductor device includes a die or a chip.

12. The method of claim 6, wherein the first planar surface includes a first dielectric material and a first conductive material, and the second planar surface includes a second dielectric material and a second conductive material, and the void is defined by the first dielectric material and the second dielectric material.

13. The method of claim 6, further comprising:
    causing the first dielectric material to contact the second dielectric material at the peripheral region of the second semiconductor device;
    providing a force on the second semiconductor device, thereby moving the void toward the peripheral region of the second semiconductor device; and
    causing the first dielectric material to contact the second dielectric material at a central region of the second semiconductor device.

14. The method of claim 6, wherein the moving of the second semiconductor device toward the first semiconductor device comprises:
    reducing an air pressure between the second semiconductor device and a machine arm to a third pressure, wherein the third pressure is lower than the first pressure; and
    lifting the second semiconductor device by the machine arm;
    increasing the air pressure between the second semiconductor device and the machine arm from the third pressure to the first pressure; and releasing the second semiconductor device from the machine arm and disposing the second semiconductor device on the first semiconductor device.

15. A system for forming a semiconductor structure, comprising:
   a first chamber, configured to provide a first low-pressure environment for a hybrid bonding operation;
   a second chamber, connected to the first chamber and configured to provide a second low-pressure environment having a pressure greater than a pressure of the first low-pressure environment;
   a controller, configured to control the hybrid bonding operation;
   a bonding apparatus, disposed in the first chamber and configured to provide a force on a central region of a semiconductor device gradually toward a peripheral region of the semiconductor device during the hybrid bonding operation; and
   a first pump, connected to a first valve disposed on an inner sidewall of the first chamber, and configured to remove air from the first chamber prior to or during the hybrid bonding operation.

16. The system of claim 15, further comprising:
   a second pump, connected to a second valve disposed on an inner sidewall of the second chamber, and configured to remove air from the second chamber prior to opening a third valve between the first chamber and the second chamber.

17. The system of claim 15, further comprising:
   a thermal component, disposed in the first chamber and configured to provide thermal energy during the hybrid bonding operation.

18. The method of claim 1, wherein the chip is a first chip, and the method further comprises:
   bonding a second chip to the wafer; and
   providing a force on the second chip, thereby moving a void from a central region of the second chip toward a peripheral region of the second chip.

19. The method of claim 1, further comprising:
   increasing a temperature of the low-pressure environment prior to or during the bonding the chip to the wafer.

20. The system of claim 15, further comprising:
   a fourth valve, disposed on another inner sidewall of the first chamber, wherein the first semiconductor device is transported into or out from the first chamber through the fourth valve.

* * * * *